United States Patent
Park et al.

(10) Patent No.: US 9,761,441 B2
(45) Date of Patent: Sep. 12, 2017

(54) PHYSICAL VAPOR DEPOSITION METHODS AND SYSTEMS TO FORM SEMICONDUCTOR FILMS USING COUNTERBALANCE MAGNETIC FIELD GENERATORS

(71) Applicant: Samsung Electronics Co., Ltd., Suwon-si, Gyeonggi-do (KR)

(72) Inventors: Jeonghee Park, Hwasung (KR); Jae Yeol Park, San Ramon, CA (US)

(73) Assignees: SAMSUNG ELECTRONICS CO., LTD. (KR); SEMICAT, INC., Milpitas, CA (US)

( * ) Notice: Subject to any disclaimer, the term of this patent is extended or adjusted under 35 U.S.C. 154(b) by 29 days.

(21) Appl. No.: 14/792,597

(22) Filed: Jul. 6, 2015

(65) Prior Publication Data
US 2015/0311065 A1   Oct. 29, 2015

Related U.S. Application Data

(62) Division of application No. 13/840,469, filed on Mar. 15, 2013, now abandoned.

(51) Int. Cl.
*C23C 14/34* (2006.01)
*H01L 21/02* (2006.01)
(Continued)

(52) U.S. Cl.
CPC .... *H01L 21/02266* (2013.01); *C23C 14/0623* (2013.01); *C23C 14/3407* (2013.01);
(Continued)

(58) Field of Classification Search
CPC combination set(s) only.
See application file for complete search history.

(56) References Cited

U.S. PATENT DOCUMENTS

| 5,252,194 A | 10/1993 | Demaray et al. |
| 6,183,614 B1 * | 2/2001 | Fu ................... H01J 37/3408 |
| | | 204/298.16 |

(Continued)

FOREIGN PATENT DOCUMENTS

KR   20120061490 A   6/2012

*Primary Examiner* — Jason M Berman
(74) *Attorney, Agent, or Firm* — Renaissance IP Law Group LLP

(57) ABSTRACT

Embodiments relate generally to semiconductor device fabrication and processes, and more particularly, to systems and methods that implement magnetic field generators configured to generate rotating magnetic fields to facilitate physical vapor deposition ("PVD"). In one embodiment, a system generates a first portion of a magnetic field adjacent a first circumferential portion of a substrate, and can generate a second portion of the magnetic field adjacent to a second circumferential portion of the substrate. The second circumferential portion is disposed at an endpoint of a diameter that passes through an axis of rotation to another endpoint of the diameter at which the first circumferential portion resides. The second peak magnitude can be less than the first peak magnitude. The system rotates the first and second portions of the magnetic fields to decompose a target material to form a plasma adjacent the substrate. The system forms a film upon the substrate.

28 Claims, 11 Drawing Sheets

(51) Int. Cl.
- *C23C 14/35* (2006.01)
- *H01J 37/34* (2006.01)
- *H01L 45/00* (2006.01)
- *C23C 14/06* (2006.01)
- *H01J 37/32* (2006.01)

(52) U.S. Cl.
CPC ........ *C23C 14/35* (2013.01); *H01J 37/32669* (2013.01); *H01J 37/345* (2013.01); *H01J 37/3405* (2013.01); *H01J 37/3452* (2013.01); *H01J 37/3455* (2013.01); *H01L 45/06* (2013.01); *H01L 45/1233* (2013.01); *H01L 45/144* (2013.01); *H01L 45/1625* (2013.01); *H01J 2237/332* (2013.01)

(56) References Cited

U.S. PATENT DOCUMENTS

| | | | |
|---|---|---|---|
| 6,491,801 B1* | 12/2002 | Gung | H01J 37/3408 204/298.19 |
| 2006/0060470 A1* | 3/2006 | Gung | C23C 14/35 204/298.02 |
| 2008/0083610 A1* | 4/2008 | Tang | C23C 14/0641 204/192.1 |
| 2010/0230281 A1 | 9/2010 | Park et al. | |
| 2011/0048934 A1 | 3/2011 | Kim et al. | |
| 2012/0142141 A1 | 6/2012 | Park et al. | |

\* cited by examiner

PHYSICAL VAPOR DEPOSITION METHODS AND SYSTEMS TO FORM SEMICONDUCTOR FILMS USING COUNTERBALANCE MAGNETIC FIELD GENERATORS

CROSS REFERENCE TO RELATED APPLICATIONS

This U.S. non-provisional patent application is a divisional of U.S. patent application Ser. No. 13/840,469, filed Mar. 15, 2013. This application is related to U.S. Nonprovisional application Ser. No. 12/551,356, filed Aug. 31, 2009, now U.S. Pat. No. 8,956,516, which issued Feb. 17, 2015, U.S. Nonprovisional application Ser. No. and Ser. No. 12/551,379 filed Aug. 31, 2009, now U.S. Pat. No. 8,936,703, issued Jan. 20, 2015, all of which are hereby incorporated by reference for all purposes.

BRIEF DESCRIPTION OF THE INVENTION

Embodiments of the invention relate generally to semiconductor device fabrication and processes, and more particularly, to systems and methods that implement magnetic field generators configured to generate rotating magnetic fields to facilitate physical vapor deposition ("PVD").

BACKGROUND OF THE INVENTION

Traditional techniques for fabricating semiconductors include vapor deposition processes, which are used typically to deposit relatively thin films onto semiconductor substrates to form electronic devices. Semiconductor manufacturers expect that vapor deposition processes and equipment are to provide a certain level of, for example, step coverage over topologies and features over which a film is deposited. FIG. 1 illustrates conventional deposition equipment, such as a DC magnetron, that is used in some traditional deposition processes. Diagram 100 includes a magnetron assembly 101 including a magnet assembly 122 connected to a counterweight 120, whereby magnetron assembly 101 is designed to rotate about an axis of rotation 108 in a chamber depicted as having chamber walls 110. Magnet assembly 122 extends a distance ("d") 102, with magnet assembly 112 extending along radius ("r2") 106 from axis of rotation 108 and counterweight 120 extending along radius ("r1") 104 from axis of rotation 108. Typically, magnetron assembly 101 is designed for semiconductor processing for a specific size of wafer, and the configuration is not well-suited to scale up for larger sizes of wafers.

FIG. 2 depicts a magnetic field typically generated by magnetron assembly 101 along the cross-section A-A' shown in FIG. 1. Diagram 200 depicts a magnetic field 216 generated by magnet assembly 122 of FIG. 1. As shown, magnetic field 216 normally has a relatively constant magnitude ("Ms") 214 along radial distance 206, which coincides with radius 106 of FIG. 1. As shown, counterweight 120 does not contribute to generation of a magnetic field along radial distance 204, which coincides with radius 104 of FIG. 1. In operation, magnetic field 216 rotates about an axis of rotation relative to a surface of a substrate 210 for fabricating a semiconductor structure, such as a film.

While functional, there are a variety of drawbacks associated with magnetron assembly 101 and the fabrication processes using the same. One drawback is that magnetron assembly 101 and the PVD processes using the magnetron assembly 101 tend to form suboptimal film structures, including instances when the size of substrate 210 increases beyond 200 mm (e.g., up to 300 mm, or greater) for certain materials to be deposited.

In view of the foregoing, it is be desirable to provide an apparatus, a system, and a method for overcoming the drawbacks of the conventional deposition processes to deposit semiconductor layers, including, but not limited to, non-metal layers (e.g., a chalcogenide-based film.)

SUMMARY OF THE INVENTION

Embodiments of the invention relate generally to semiconductor device fabrication and processes, and more particularly, to systems and methods that implement magnetic field generators configured to generate rotating magnetic fields to facilitate physical vapor deposition ("PVD"). In one embodiment, a system generates a first portion of a magnetic field having a first peak magnitude of magnetic field strength adjacent a first circumferential portion of a semiconductor substrate. The system also can generate a second portion of the magnetic field having a second peak magnitude of magnetic field strength adjacent to a second circumferential portion of the semiconductor substrate. The second circumferential portion is disposed at an endpoint of a diameter that passes through an axis of rotation to another endpoint of the diameter at which the first circumferential portion resides. The second peak magnitude can be less than the first peak magnitude. The system rotates the first portion of the magnetic field and the second portion of the magnetic field about the axis of rotation to decompose a target material to form a plasma at a plasma processing region adjacent the semiconductor substrate within a chamber. Also, the system operates to form a film upon the semiconductor substrate.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION

Figure 1:
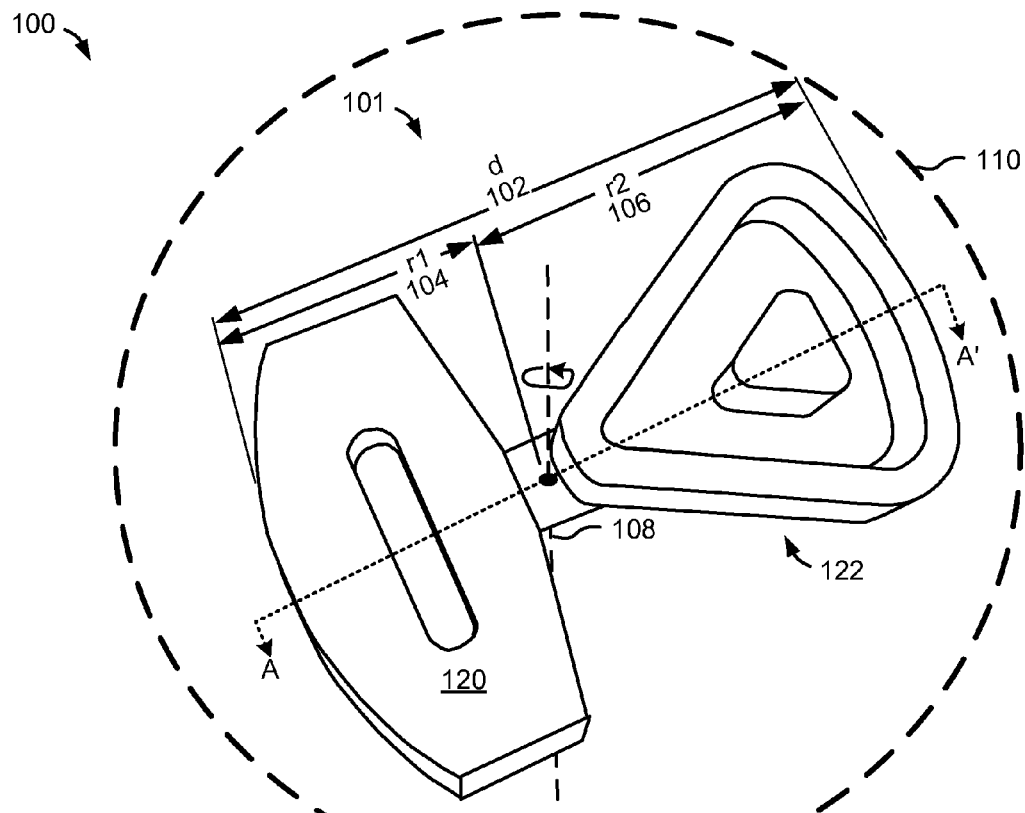
FIG. 1 illustrates conventional deposition equipment that is used in some traditional deposition processes.
Figure 2:
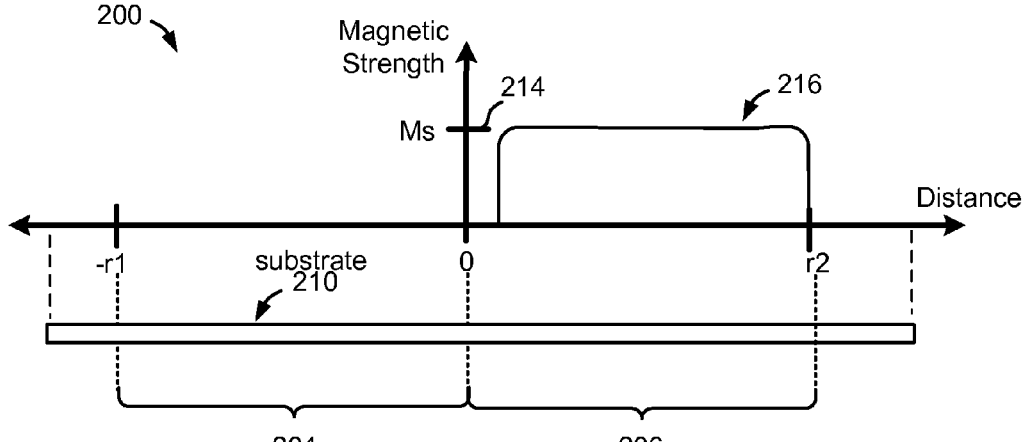
FIG. 2 depicts a magnetic field typically generated by a conventional magnetron assembly along the cross-section A-A' shown in FIG. 1.
Figure 3:
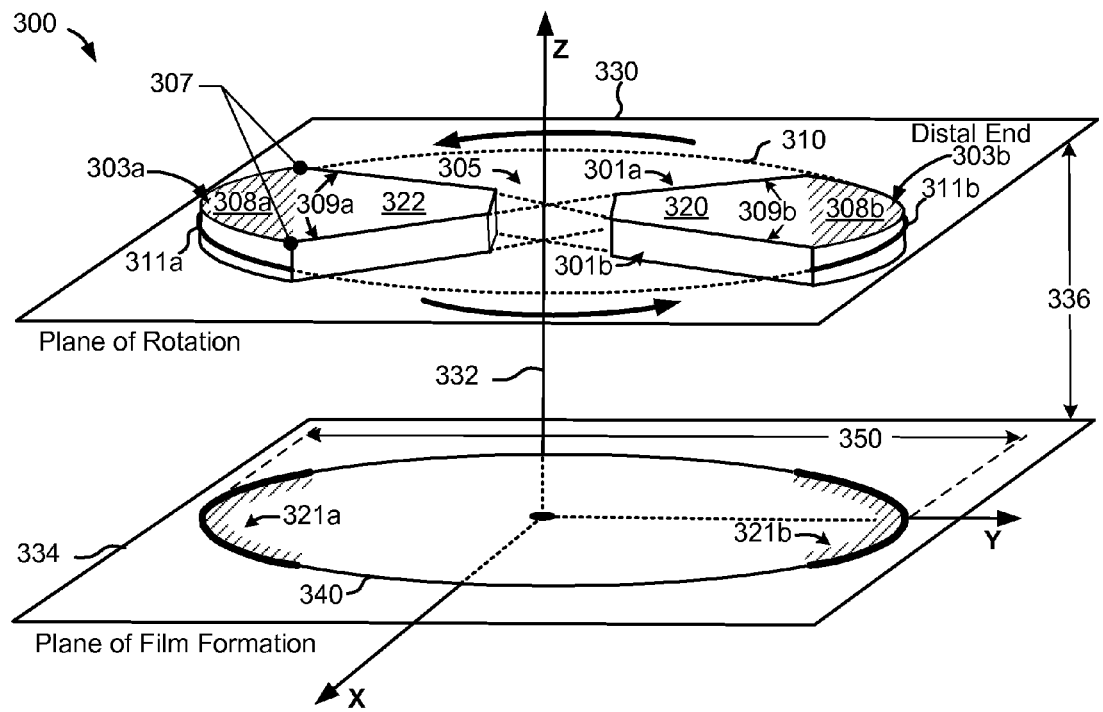
FIG. 3 depicts an example of an apparatus for depositing a film structure in relation to a semiconductor substrate in accordance with at least one embodiment.

FIG. 3 depicts an example of an apparatus for depositing a film structure in relation to a semiconductor substrate in accordance with at least one embodiment. Diagram 300 depicts a perspective view of an arrangement of magnetic field generators 320 and 322, each of which is configured to rotate about an axis of rotation 332 to facilitate generation of an electromagnetic field having a magnetic profile (or a portion thereof) that contributes to plasma processing in a plasma processing region. A electromagnetic field and/or a magnetic field can induce ionization of the molecules or atoms of a target material to establish, for example, the formation of plasma to perform vapor deposition processes (e.g., PVD, CVD, and the like). In particular, a magnetic field generator 320 is configured to rotate—either clockwise or counter-clockwise—about axis of rotation 332 in a region 310, such as a circular region in a plane of rotation 330. Magnetic field generator 320 is further configured to generate a first magnetic field profile portion having a first magnitude, the first magnetic field profile describing the magnetic field adjacent to a circumferential portion 311b of a circular region 310. Magnetic field generator 322 is configured to rotate about axis of rotation 322 in opposition to magnetic field generator 320, and can be further configured to generate a second magnetic field profile portion having a second magnitude, the second magnetic field profile describing the magnetic field adjacent to a circumferential portion 311a of circular region 310. One or more of the first and second magnetic field profiles can either be of constant or variable magnitude. Further, the first and second magnetic field profiles can either be similar or different. According to some embodiments, the second magnitude can be less than the first magnitude. At least in some embodiments, magnetic field generator 320 and magnetic field generator 322 can be referred to as a rotatable magnetic field generator and a counterbalance magnetic field generator, respectively.

Further to FIG. 3, magnetic field generator 320 and magnetic field generator 322 are configured to generate a magnetic field between plane of rotation 330 and a plane 334, which is parallel to plane of rotation 330. The magnetic field extends along a diameter from circumferential portion 311b to circumferential portion 311a. Plane 334 and plane of rotation 330 are separated by a distance 336. Rotation of magnetic field generators 320 and 322 facilitate plasma formation to form a film upon substrate 340. Magnetic field generator 322 can include a mass equivalent or approximate to that of magnetic field generator 320 to counter act a force (e.g., centripetal force) generated magnetic field generator 320 on a shaft or another structure coincident with axis of rotation 332 (not shown) about which magnetic field generator 320 rotates. Further, magnetic field generator 322 provides a portion of the magnetic field that can extend over some or all of a diameter of circular region 310. As used herein, at least in some cases, the term "circumferential portion" can describe areas, regions, lines, surfaces, structures, etc. disposed at or adjacent an edge or constituting an outer boundary relative to an axis of rotation. For example, circumferential portions 311a and 311b includes areas or regions at or near a boundary of circular region 310. Note, too, that "circumferential" can refer to a direction, such as along a portion of a circle centered at an axis, or in tangential direction that is perpendicular to a radial line extending from the axis of rotation.

Figure 4:
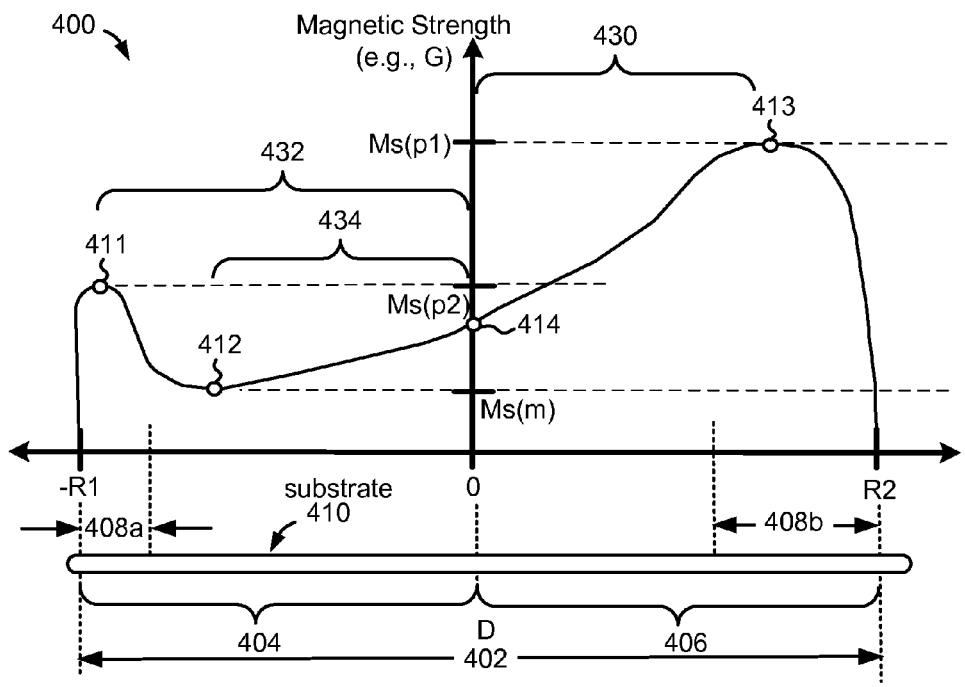
FIG. 4 depicts an example of a magnetic field profile in accordance with at least one embodiment.

FIG. 4 depicts an example of a magnetic field profile in accordance with at least one embodiment. Magnetic field profiles can be generated by magnetic field generators in accordance with various embodiments. One example of a magnetic field profile is depicted as magnetic field profile 400, which is generated by magnetic field generators 320 and 322 of FIG. 3. Magnetic field profile 400 extends along a distance ("D") 402, which is representative of a distance (e.g., a diameter) between a distal end 303a of magnetic field generator 320 and distal end 303b of magnetic field generator 322. According to some embodiments, magnetic field profile 400 can depict a magnetic characteristic such as, but not limited to, magnetic strength expressed in relative units of Gauss ("G") relative to a radial distance from a reference point ("0") through which axis of rotation 332 of FIG. 3 passes. Magnetic field generator 320 of FIG. 3 (or a portion thereof) is configured to generate a magnetic field profile portion 406, whereas magnetic field generator 322 of FIG. 3 (or a portion thereof) is configured to generate a magnetic field profile portion 404. In some embodiments, magnetic field generators form magnetic field portions having field strengths configured to generate plasma for semiconductor wafer processing in accordance with magnetic field profile portions 404 and 406, whereby the field strengths associated with magnetic field profile portions 404 and 406 can be configured to constant or can vary, for example, as a function of distance 402.

In the example shown, a profile of magnetic strength for the magnetic field, such as magnetic field profile 400, has one or more peak or maximum magnitudes, such as peak magnitude ("Ms(p1)") 413, relative to a minimum magnitude ("Ms(m)") 412. Either or both of peak magnitude 413 and minimum magnitude 412 can represent the maximum and the minimum magnitudes, respectively, for either magnetic field profile portion 406 or magnetic field profile 400. Further, profile 400 of magnetic strength also can have one or more other peak or maximum magnitudes, such as peak magnitude ("Ms(p2)") 411, relative to a minimum magnitude 412. According to some embodiments, peak magnitudes 411 and 413 are local peak magnitudes (i.e., each is a maximum in respective magnetic field profile portions 404 and 406). Either or both of peak magnitude 411 and minimum magnitude 412 can represent maximum and minimum magnitudes, respectively, for either magnetic field profile portion 404 or magnetic field profile 400. A magnetic field generator, such as magnetic field generator 320 of FIG. 3, or a portion thereof, can be configured to generate a magnetic strength profile portion 406 such that peak magnitude 413 is generated to influence the formation of a semiconductor layer or film on substrate 410 at or adjacent to a region 408b, according to the fabrication processes of the various embodiments. Further to the example shown, the magnetic field strength decreases from peak magnitude 413 to a magnitude 414 as a function of distance from the reference point. In some cases, magnitude 414 can represent a magnitude of magnetic field strength generated by, for example, both magnetic field generators 320 and 322 of FIG. 3. While region 408b is depicted as being at or adjacent to distance R2, which can coincide with an edge of substrate 410, region 408b and/or peak magnitude 413 can be located anywhere along distance 402 of profile 400. In this example, peak magnitude 413 is located at distance 430 from the reference point. Further, minimum magnitude 412 can represent a magnitude field magnetic that is negligible or equivalent to zero, or can represent an intermediate magnitude of magnetic field strength that is non-zero.

Similarly, another magnetic field generator serving as a counterbalance, such as magnetic field generator 322 of FIG. 3, or a portion thereof, can be configured to generate a magnetic strength profile portion 404 such that peak magnitude 411 is generated to influence the formation of a semiconductor layer or film on substrate 410 at or adjacent to a region 408a, according to the fabrication processes of the various embodiments. Further, peak magnitude 411 of the magnetic field strength decreases to a minimum magnitude 412 as a function of distance from the reference point. While region 408a is depicted as being at or adjacent to distance R1, which can coincide with another edge of substrate 410, region 408a and/or peak magnitude 411, as well as minimum magnitude 412, can be located anywhere along distance 402 of profile 400. In this example, peak magnitude 411 and minimum magnitude 412 are located at distances 432 and 434, respectively, from the reference point. Specifically, minimum magnitude 412 of the magnetic strength is disposed between axis of rotation 332 of FIG. 3 and peak magnitude 411 of the magnetic field.

In view of the foregoing, magnetic field generator 322 of FIG. 3 can serve a multi-function purpose to serve as a counterweight and to generate a portion of the magnetic field that can extend on either side of or through axis of rotation 332. Thus, a magnetic field extending from one end (e.g., distal end 303b) of circular region 310 to another end (e.g., distal end 303a) can be applied to a processing region in which plasma is generated for processing, for example, semiconductor wafers during vapor deposition (e.g., "PVD") to form semiconductor structures. Either magnetic field generator 320 or 322, or both, can be configured to generate varying magnetic field strength values at various units of surface area defined by plane 330 of rotation. In some embodiments, magnetic field generators 320 and 322 are configurable to generate different magnitudes of magnetic strength to form any number of magnetic strength profiles other than profile 400 depicted in FIG. 4. Further, the surface areas (e.g., the sizes of cross-sectional areas in plane 330) of magnetic field generator 320 or 322 are configurable to vary the magnetic strength and/or the flux density (e.g., concentration of a magnetic flux per unit area). For instance, angles coextensive with lateral portions of the magnetic field generators 320 and 322 can be configured to modify the magnetic strength to, for example, enhance localized magnetic field strength (e.g., increase the concentration of magnetic field strength, or the flux density) relative to other regions in which semiconductor films are formed. In some cases, supplemental magnetic generators (not shown) can be disposed adjacent to the lateral portions to enhance or modify the localized magnetic field strength. Alternatively, lateral portions of the magnetic field generators 320 and 322 can be shaped to include protruding edge surfaces (not shown) in, for example, in a zigzag shape to, for example, facilitate ignition of plasma, among other things. Magnetic field generator 320 and 322 can enhance the symmetry of semiconductor structures formed at the edge portions and the center portion of a semiconductor substrate. Therefore, the structures and/or functionalities of magnetic field generator 320 and 322 can enhance side wall and/or step coverage over topologies and features over which a film is deposited. For example, the structures and/or functionalities of the various apparatuses and/or processes can enhance uniformity of thickness of layers deposited on a substrate, such as a layer including germanium, antimony and tellurium ("GST") in the form of, for example, $Ge_2Sb_2Te_5$, or any variants thereof, as well as any other type of semiconductor film. The structures and/or functionalities of magnetic field generator 320 and 322 can facilitate deposition over substrates sized at 200 mm and greater, including substrates having a size of 300 mm. In some embodiments, the magnetic field generators can generate sufficient magnetic field magnitudes over a sufficient amount of area over substrate 340 to provide uniform coverage of a layer of material being deposited (e.g., a metal or non-metal material, compound, molecule or element), thereby reducing deposition non-uniformity across the substrate at exemplary amounts of, for example, less than 3% deviations.

Referring back to FIG. 3, magnetic field generators 320 and 322 can configured to have any shape, for example, to obtain a certain localization of magnetic field strength, according to various embodiments. According to some embodiments, the term "localization" can refer to, for example, a concentration of magnetic field(s) that may or may not enhance the magnetic flux density. In some embodiments, either one of magnetic field generators 320 and 322, or both, can be configured to have a triangular-shaped periphery. In instances that magnetic field generators 320 and 322 both have triangular-shaped peripheries, one of the vertices of the triangular-shaped peripheries is coupled at or adjacent to the other of the vertices of the other triangular-shaped periphery at or near axis of rotation 332. The vertices of the triangular-shaped peripheries and/or areas (e.g., surface or cross-sectional areas) each lie on a line, such as an axis of rotation, that is perpendicular to a radial line. In these cases, the triangular-shaped peripheries can form a bowtie-shaped periphery. For example, a triangular-shaped periphery can extend from axis of rotation 332 to one of points 307 to the other of points 307, and back to axis of rotation 332. In some embodiments, cross-sectional areas of magnetic field generators 320 and 322 can be triangular-shaped in plane 330. In some embodiments, either one of magnetic field generators 320 and 322, or both, can be configured to have a sector-shaped periphery, whereby a sector includes portion of a circle or a disk bounded by two radii disposed at an angle between the two radii, and the sector includes an arc. For example, magnetic field generator 320 can include an arc coextensive with circumferential portion 311a of circular region 310, and magnetic field generator 322 can include a similar arc coextensive with circumferential portion 311b. According to some embodiments, magnetic field generators 320 and 322 include permanent magnet material of different magnetic characteristics (e.g. per unit area) to produce a magnetic strength profile, an example of which is depicted in FIG. 4. Note that the term "triangular-shaped"

can refer, at least in some implementations, to shapes having lateral portions spaced at an angle (e.g., an acute angle), such that magnetic field generators can have triangular shapes, sector shapes, or any other shape that can form a magnetic field generator for applying a magnetic field and/or counterbalancing a magnetic field generator.

Lateral portions can be disposed at or adjacent the portions of the periphery that lie along or substantially along radial lines, examples of which are depicted as lateral portions 301a and 301b of magnetic field generator 320. Magnetic field generator 322 can have similar lateral portions, too. As such, the sizes of cross-sectional areas in plane 330 of magnetic field generators 320 and 322 are configurable to vary the magnetic strength (and/or concentrations thereof) by selecting, among other things, an angle between the lateral portions. For example, angle 309b between lateral portions 301a and 301b can establish a cross-sectional area in plane 330 for magnetic field generator 320, and that angle is configurable to establish a magnetic field profile in association with magnetic field generator 322. Similarly, angle 309a between the lateral portions of magnetic field generator 322 can establish another cross-sectional area in plane 330 for magnetic field generator 322. In some embodiments, angles 309a and 309b can be the same or can be different. Accordingly, magnetic field generator 320 can include an equivalent or a different cross-sectional area in plane of rotation 330 than magnetic field generator 322.

In some embodiments, magnetic field generators 320 and 322 can be configured to generate a magnetic profile over or substantially over a diameter 350 of substrate 340. In some examples, diameter 350 of substrate 340 can be representative of distance 402 for substrate 410 of FIG. 4. Referring back to FIG. 3, portions of magnetic field generators 320 and 322 can conceptually exclude magnetic field generating structures at approximately center region 305. Or, portions of magnetic field generators 320 and 322 can include magnetic field generating structures, such as magnetic elements, in center region 305 (not shown). Regardless, center region includes a structure for affixing magnetic field generators 320 and 322 relative to axis of rotational 332 so that magnetic field generators 320 and 322 can rotate about that axis.

Regions of magnetic field generation 308a and 308b can be configured to generate magnetic fields with peak magnitudes (e.g., local peak magnitudes or otherwise), according to at least some embodiments. In some examples, regions of magnetic field generation 308a and 308b can be disposed respectively at or adjacent circumferential portions 311a and 311b of a circular region 310. In operation, as magnetic field generators 320 and 322 rotate about axis of rotational 332 to rotate a magnetic field profile about the axis, with regions of magnetic field generation 308a and 308b generating magnetic fields (e.g., in the z-axis direction) with peak magnitudes adjacent to or above regions 321a and 321b, respectively, of substrate 340. In some examples, regions 321a and 321b can coincide with or can be representative of regions 408a and 408b, respectively, of FIG. 4. Note that FIGS. 3 and 4 depict an example of some implementations, and various embodiments of magnetic field generators and magnetic field strength profiles are not limited to those shown or described. For example, counter-balancing magnetic field generator 320 can be replaced with a counterweight (e.g. that does not generate magnetic fields) for use with magnetic field generator 320, which is configured to generate a variable magnetic field strength profile as a function of distance. In another example, there can be more than two magnetic field generators (e.g., there can be three, four, or more magnetic field generators coupled at the axis of rotation).

Figure 5:
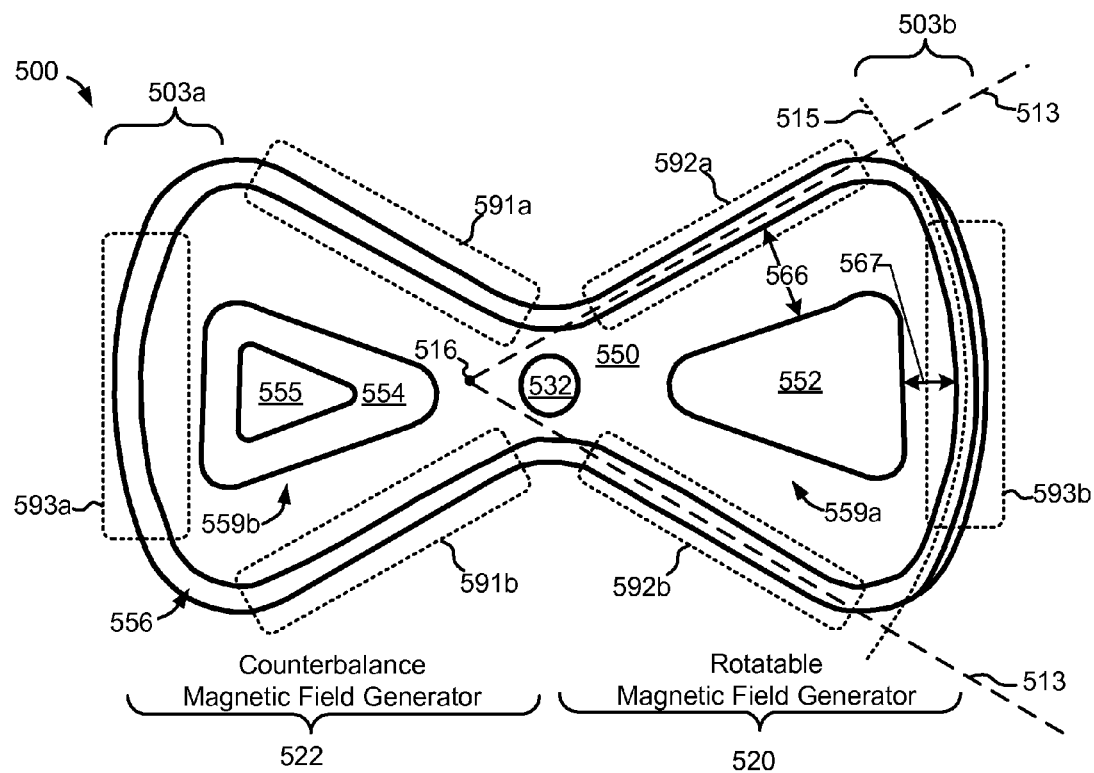
FIG. 5 is a view of a surface of a magnetic field generator apparatus configured to confront a surface of a substrate, according to various embodiments.

FIG. 5 is a view of a surface of a magnetic field generator apparatus configured to confront a surface of a substrate, according to various embodiments. Magnetic field generator apparatus 500 includes an opening 532 through which a rotatable shaft is disposed and affixed to magnetic field generator apparatus 500. Magnetic field generator apparatus 500 includes a rotatable magnetic field generator 520 and a counterbalance magnetic field generator 522. Magnetic field generator apparatus 500 also includes interior portions 559a and 559b within an interior region of rotatable magnetic field generator 520 and an interior region of a counterbalance magnetic field generator 522, respectively. In various examples, rotatable magnetic field generator 520 and counterbalance magnetic field generator 522 each can be composed of one or more individual structures combined to form magnetic field generator apparatus 500. Further, rotatable magnetic field generator 520 and counterbalance magnetic field generator 522 can be integrated, or otherwise formed to produce magnetic field generator apparatus 500 as a monolithic structure. In some embodiments, interior portions 559a and 559b, and one or more periphery structures can include one or more magnetic structures configured to generate magnetic flux to magnetically couple with other magnetic structures.

Rotatable magnetic field generator 520 and a counterbalance magnetic field generator 522 can include lateral portions and at least one distal portion. Examples of lateral portions (or subportions thereof) of rotatable magnetic field generator 520 are depicted as lateral portions 592a and 592b, and examples of lateral portions (or subportions thereof) of counterbalance magnetic field generator 522 are depicted as lateral portions 591a and 591b. Examples of distal portions for rotatable magnetic field generator 520 and counterbalance magnetic field generator 522 are depicted as distal portion 593b and distal portion 593a, respectively. As depicted, lateral portions 592a and 592b are oriented at an angle with respect to a reference point 516, which can lie either off the axis of rotation (as shown) or coincident with the axis of rotation (e.g., within opening 532). Lateral portions 592a and 592b each are oriented along or substantially along one of radial lines 513. According to some embodiments, the lateral portions need not align coincide with radial lines 513. That is, a subportion of lateral portions 592a and 592b need not be in alignment with radial lines 513. Further, the lateral portions can have curved or substantially curved portions (e.g., either convex or concave). Or, the lateral portions can have any other shape. The one or more lateral portions 592a, 592b, 591a, and 591b can vary in circumferentially direction along radial lines 513. For instance, one or more of lateral portions 592a, 592b, 591a, and 591b can vary circumferentially in alternating clockwise and counter-clockwise directions along radial lines 513 to form equidistant line segments that cross back and forth along radial lines 513 to form, for example, zigzag shapes. Optionally, distal portions 593a and 593b can coincide or substantially coincide with arc segments between radial lines 513, such as arc 515. Any of the distal portions can have an arc-like shape, such as distal portion 593a, which can be coextensive with arc 515. Or, distal portions 593a and 593b can be formed to have any other shape, including straight (e.g., one or more straight line segments between radial lines 513). As used herein, at least in some cases, the term "distal portion" can describe areas, regions, lines, surfaces, structures, etc. disposed at or adjacent an edge or constituting a boundary opposite to a proximal portion coupled at an axis of rotation. For example, distal portions 593a and 593b includes areas or regions at or near a boundary (e.g., an arc-like or tangential boundary between radial lines). Distal portions 593a and 593b can be described, in some cases, as peripheral portions as they are portions of the periphery of a magnetic field generator apparatus. In other cases, distal portions 593a and 593b can be described, in some cases, as circumferential portions that are coextensive with an arc or circle centered at the axis of rotation. As used herein, at least in some cases, the term "lateral portion" can describe areas, regions, lines, surfaces, structures, etc. disposed at or adjacent an edge or constituting a boundary relative coextensive with a radial line, or with at least one line segment extending from an axis of rotation to a distal portion.

Peripheral portion 556 can be formed on a base 550 as a contiguous structure configured to generate one or more magnetic fields, or as a structure composed of any number of constituent substructures configured to generate one or more magnetic fields, the substructures being similar or different in structure and/or functionality relative to each other. Further, interior portions 559a and 559b each can be formed as a contiguous structure configured to generate one or more magnetic fields, or a structure composed of any number of constituent substructures configured to generate one or more magnetic fields, the substructures being similar or different in structure and/or functionality relative to each other. In some embodiments, periphery structure 556 is a magnetically permeable material (e.g., a magnetic metal) disposed on a number of magnetic elements (not shown) configured to generate magnetic fields, the magnetic elements disposed between periphery structure 556 and base 550. Also, a subset of magnetic elements are disposed between interior region structure 552, which can be a magnetically permeable material, and base 550, whereas another subset of magnetic elements are disposed between interior region structure 554, which can be a magnetically permeable material, and base 550. Note that interior region structure 554 can include an opening 555 to base 550 in which magnetic elements are absent. Note that any of interior portions 559a and 559b, distal portions 593a and 593b, and lateral portions 592a, 592b, 591a, and 591b can be representative of any structure configured to generate magnetic fields and are not limited to the structures described in the various examples. Examples of structures configured to generate magnetic fields include magnetic elements, such as "magnets." The term "magnet" can refer to a body that produces a magnetic field externally unto itself, including permanent magnets (e.g., including permanent magnet materials), electromagnets, and the like. As used herein, the term "magnetic field generator" can refer, at least in some embodiments, to one or more permanent magnets, electromagnets, or any other structure known to produce magnetic fields.

In some embodiments, interior portion 559a, distal portion 593a, lateral portion 592a, and lateral portion 592b of rotatable magnetic field generator 520 are configured to include magnetic structures for generating a first magnetic field profile. Interior portion 559b, distal portion 593b, lateral portion 591a, and lateral portion 591b of rotatable magnetic field generator 522 are configured to include magnetic structures for generating a second magnetic field profile. In one example, interior portion 559a is a magnetic structure having a first direction of polarization and distal portion 593a, lateral portion 592a, and lateral portion 592b are magnetic structures having a second direction of polarization. In some instances, interior portion 559a is configured to form a first magnet pole (e.g., a south pole), whereas distal portion 593a, lateral portion 592a and lateral portion 592b collectively form a second magnet pole (e.g., a north pole). Distal portion 593a is magnetically coupled via gap 567 to interior portion 559a. Lateral portions 592a and 592b are magnetically coupled via gaps, such as gap 566, to interior portion 559a. Similarly, interior portion 559b is a magnetic structure having a first direction of polarization and distal portion 593b, lateral portion 591a, and lateral portion 591b are magnetic structures having a second direction of polarization. As such, interior portion 559b is configured to form a first magnet pole (e.g., a south pole), and distal portion 593a, lateral portion 592a and lateral portion 592b collectively form a second magnet pole (e.g., a north pole). Distal portion 593b is magnetically coupled via a gap to interior portion 559b, and lateral portions 592a and 592b are magnetically coupled via other gaps to interior portion 559b. According to some examples, gaps 567 and 566, as well as the gaps in counterbalance magnetic field generator 522 are configurable to influence the magnitudes of magnetic strength and/or flux density in the magnetic field profiles for rotatable magnetic field generator 520 and counterbalance magnetic field generator 522. According to some embodiments, one or more groups of magnetic elements (not shown) are disposed at or adjacent a distal end 503b in rotatable magnetic field generator 520 to generate a first peak magnitude. Also, one or more groups of magnetic elements (not shown) are disposed at or adjacent a distal end 503a of counterbalance magnetic field generator 522 to generate a second peak magnitude.

Figure 6:
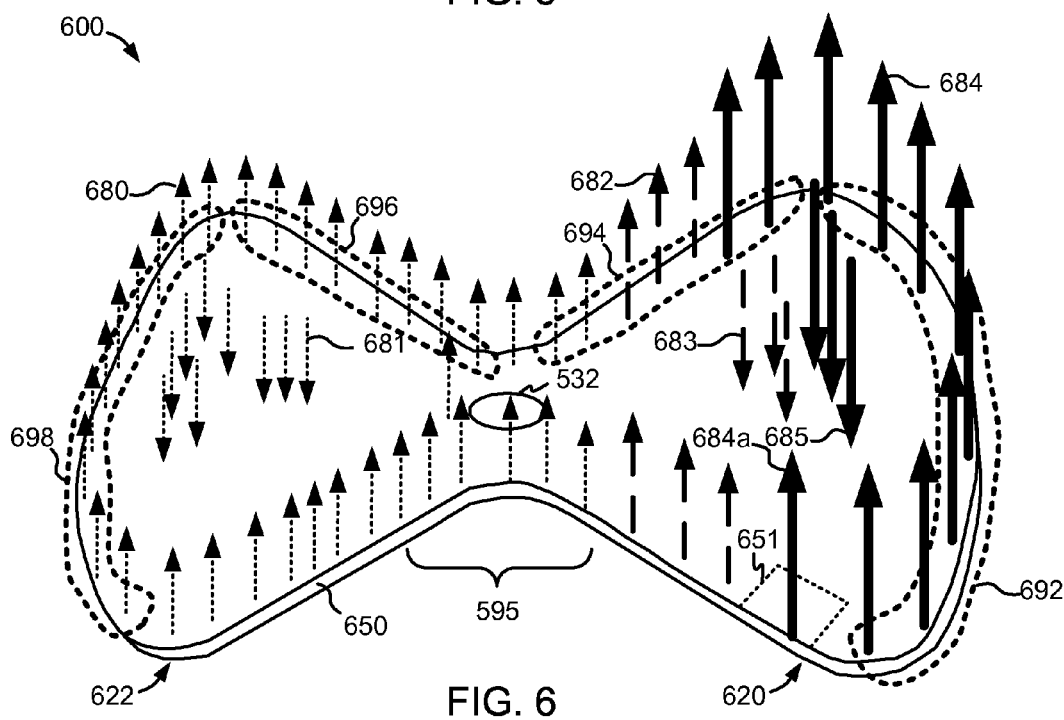
FIG. 6 depicts distributions of magnetic strength, according to some embodiments.

FIG. 6 depicts distributions of magnetic strength, according to some embodiments. Magnetic field generator apparatus 600 includes rotatable magnetic field generator 620 and counterbalance magnetic field generator 622 and the relative magnitudes of magnetic strength, for example, per unit area 651 relative to base 650, as well as the directions of polarization indicated by arrow heads. Rotatable magnetic field generator 620 and counterbalance magnetic field generator 622 are configured to rotate about axis of rotation 532 in center region 595. As shown, rotatable magnetic field generator 620 is configured to generate magnetic fields and/or flux at a distal portion 692 at a distal end having a first magnitude 684 in a first direction of polarization (e.g., as north poles). Lateral portions 694 of rotatable magnetic field generator 620 are configured to: (1) generate magnetic fields and/or flux at or adjacent to distal portion 692 with the first magnitude 684 for a longer range of radial distances from axis of rotation 532, (2) generate magnetic fields and/or flux with a second magnitude 682 for an intermediate range of radial distances from axis of rotation 532, and (3) generate magnetic fields and/or flux with a third magnitude 680 for an shorter range of radial distances from axis of rotation 532 (and into center region 595). First magnitude 684 of the magnetic field is greater than second magnitude 682, which, in turn, is greater than third magnitude 680, all of which share the same direction of polarization.

An interior portion of rotatable magnetic field generator 620 is shown to generate magnetic fields and/or flux at a first magnitude 685, the magnetic fields and/or flux having a second direction of polarization (e.g., as south poles). Further, the interior portion also generates magnetic fields and/or flux at a second magnitude 683, with the magnetic fields and/or flux being in the second direction of polarization. The magnitudes and directions of polarization of rotatable magnetic field generator 620 can be generated by magnetic elements, such as permanent magnets. Further, more or fewer magnitudes that the three magnitudes can be implemented. Further, the magnitudes and directions of polarization of rotatable magnetic field generator 620 are configured to shape and generate a magnetic field profile portion having a first magnitude adjacent to the distal end (e.g., based on magnetic coupling between north and south poles).

Counterbalance magnetic field generator 622 is configured to generate magnetic fields and/or flux at a distal portion 698 at a distal end having a third magnitude 680 in a first direction of polarization (e.g., as north poles). Lateral portions 694 of rotatable magnetic field generator 620 also are configured to generate magnetic fields and/or flux with a third magnitude 680 along radial distances from the distal end to the axis of rotation 532 (and into center region 595). The magnetic fields having third magnitude 680 share the same direction of polarization. An interior portion of counterbalance magnetic field generator 622 is shown to generate magnetic fields and/or flux at third magnitude 681 and at a second direction of polarization (e.g., as south poles). The magnitudes and directions of polarization of counterbalance magnetic field generator 622 can be generated by magnetic elements, such as permanent magnets. Further, more or fewer magnitudes that the magnitudes shown can be implemented. Further, the magnitudes and directions of polarization of counterbalance magnetic field generator 622 are configured to shape and generate a magnetic field profile portion having a second magnitude adjacent to the distal end (e.g., based on magnetic coupling between north and south poles). Note that the individual arrows of FIG. 6 can represent flux per unit area, such as magnitude 684a of unit area 651. Or, the individual arrows of FIG. 6 can represent the magnetic flux generated by a discrete magnetic element, such as a permanent magnet.

Figure 7:
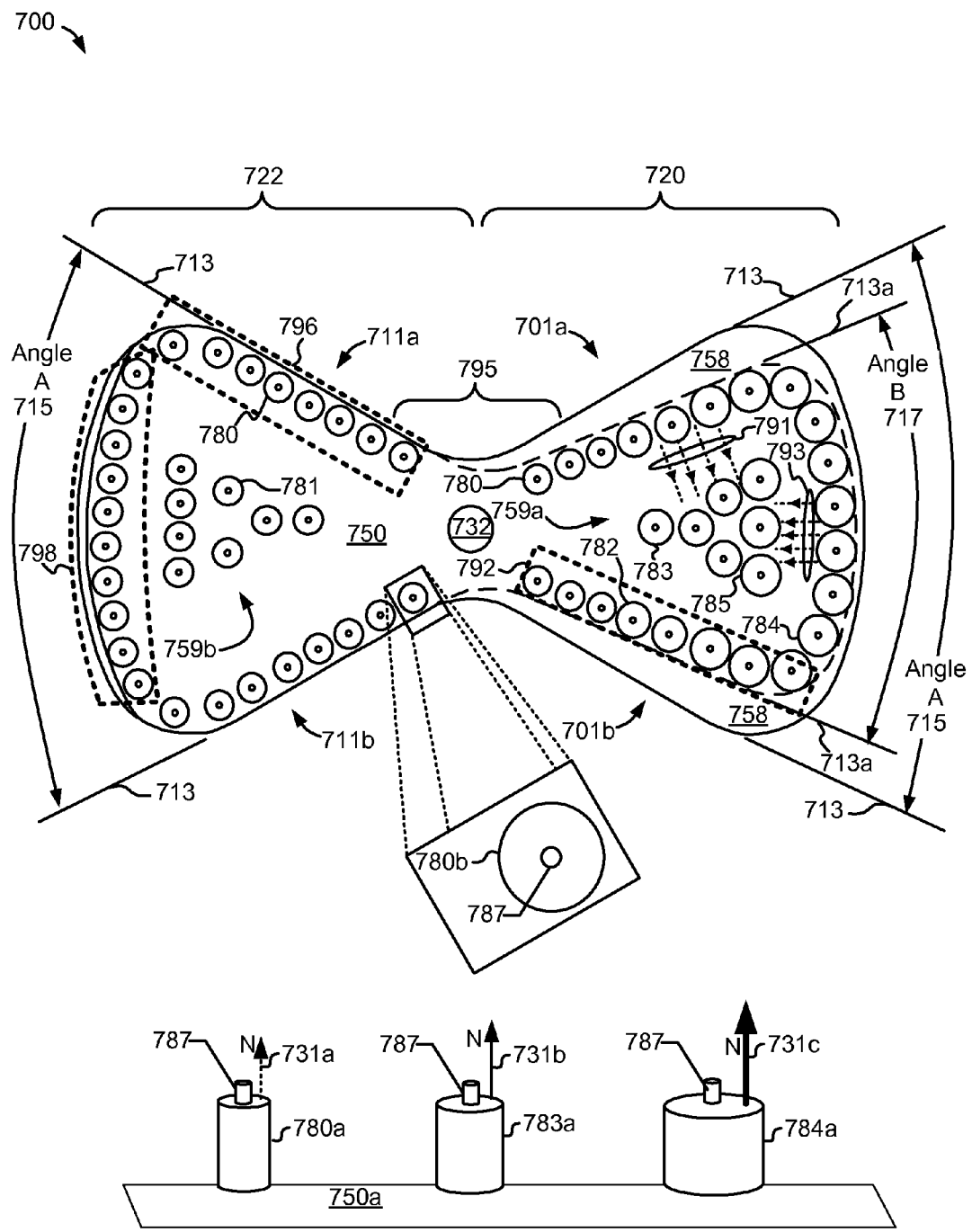
FIG. 7 depicts an example of an arrangement of magnetic elements for a magnetic field generator apparatus, according to some embodiments.

FIG. 7 depicts an example of an arrangement of magnetic elements for a magnetic field generator apparatus, according to some embodiments. Magnetic field generator apparatus 700 includes rotatable magnetic field generator 720 and counterbalance magnetic field generator 722, both including various magnetic elements disposed on base 750. Also, magnetic field generator apparatus 700 includes interior portions including magnetic elements. Rotatable magnetic field generator 720 and counterbalance magnetic field generator 722 are configured to rotate about axis of rotation 732 in center region 795.

Lateral portions 711a and 711b of counterbalance magnetic field generator 722, such as lateral portion 796, and distal portion 798 include magnetic elements 780, each having an equivalent capacity for generating similar amounts of magnetic flux in a first direction of polarization. Interior portion 759b includes magnetic elements each having a capacity for generating similar amounts of magnetic flux in a second direction of polarization. Lateral portions 711a and 711b are shown to be coextensive with radial lines 713 at an angle ("A") 715. Lateral portions 701a and 701b of rotatable magnetic field generator 720, such as lateral portion 792, include different or the same magnetic elements. In this example, lateral portions 701a and 701b include magnetic elements 780, 782, and 784, each of which share a common direction of polarization (e.g., as north poles). Interior portion 759a includes magnetic elements each having a capacity for generating similar or different amounts of magnetic flux in a second direction of polarization (e.g., as south poles). In particular, magnetic elements 785 generate similar magnitudes of flux as magnetic elements 784, but in a second direction of polarization. Similarly, magnetic elements 783 generate similar magnitudes of flux as magnetic elements 782, but in a second direction of polarization.

In operation, magnetic elements in lateral portions 711a and 711b and distal portion 798 magnetically couple to magnetic elements 781 in interior region 759b to form magnetic fields having a profile that can vary along a radial line from the axis of rotation. Further, magnetic elements in lateral portions 701a and 701b and the distal portion (e.g., magnetic elements 784) magnetically couple to magnetic elements 783 and 785 in interior region 759a to form magnetic fields having a profile that can vary along a radial line from the axis of rotation. Specifically, magnetic elements 784 in the distal portion of rotatable magnetic field generator 720 generate magnetic flux 793 passing in radial direction through to at least magnetic elements 785 and others in interior portion 759a. Similarly, at least magnetic elements 782 and 784 in lateral portions 701a and 701b of rotatable magnetic field generator 720 generate magnetic flux 791 passing in a circumferential or tangential direction (e.g., perpendicular to a radial line extending from the axis of rotation) through to at least magnetic elements 783 and 785 in interior portion 759a. Magnetic elements can be composed of similar or different magnetic materials, such as one or more rare-earth magnet materials that are known in the art, such as Neodymium Iron Boron ("NdFeB"), Samarium Cobalt ("SmCo") and variants of both, as well as ceramic magnets and iron-based magnets. In some embodiments, lateral portions 701a and 701b of rotatable magnetic field generator 720 can be coextensive with radial line 713, wherein in other embodiments, lateral portions 701a and 701b of rotatable magnetic field generator 720 can be coextensive with radial lines 713a at an angle ("B") 717, which, in turn, reduces the cross-sectional area of rotatable magnetic field generator 720 by an amount 758. In some cases, magnetic elements, such as magnetic element 780b, includes a projection 787 for attaching or securing within magnetic field generator apparatus 700. In some examples, magnetic elements 780, 782, and 784 can be differently-sized relative to each other, and can include different amounts of permanent magnet material. For example, magnetic element 784a (similar to element 784) is depicted as being relatively larger in diameter and generates a magnetic field strength 731c, which is depicted as being capable of generating the greatest amount of flux. Magnetic element 782a (similar to element 782) is depicted as being relatively moderate in diameter and generates a magnetic field strength 731b, which is depicted as being capable of an intermediate amount of flux. Magnetic element 780a (similar to element 780) is depicted as being relatively small in diameter and generates a magnetic field strength 731a, which is depicted as being capable of generating the least amount of flux (as depicted by the relative sizes of the arrows). Magnetic elements 780a, 783a, and 784a are shown disposed on a portion of base 750a, which is a portion of base 750.

Figure 8:
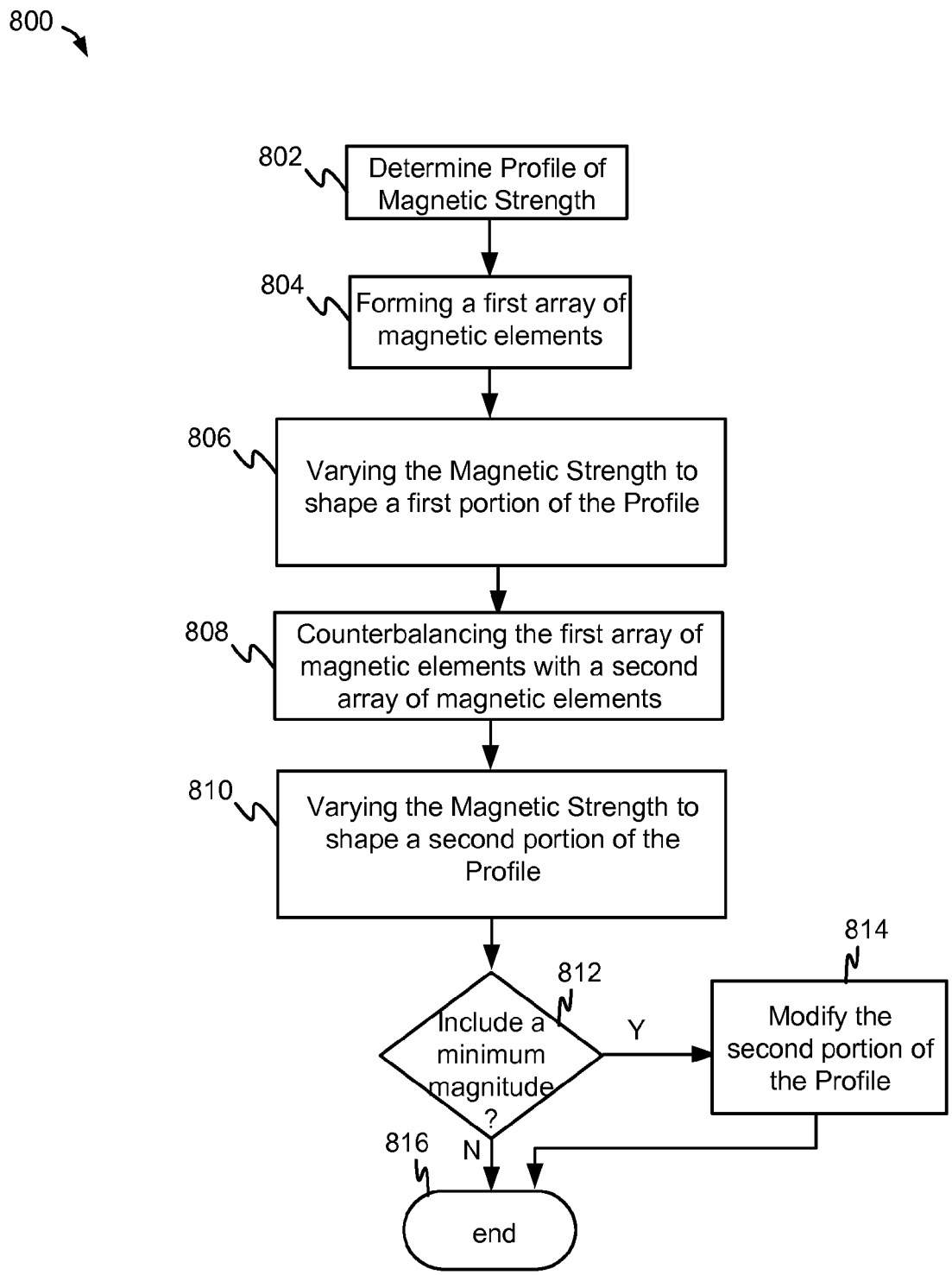
FIG. 8 is an example of a flow chart depicting a process by which to manufacture a magnetic field generator apparatus, according to an embodiment.

FIG. 8 is an example of a flow chart depicting a process by which to manufacture a magnetic field generator apparatus, according to an embodiment. In flow 800, a profile of magnetic strength is determined at 802. For example, a desired profile of magnetic strength can be based on the types of materials being deposited, the size of the substrate, the step and sidewall coverage, and/or other like factors. At 804, a first array of magnetic elements is formed. For example, lateral, distal and interior portions of a rotatable magnetic field generator can be formed. At 806, the magnetic field strength can be modified or configured to form a certain shape of a portion of the profile of magnetic field strength. For example, a supplemental array of magnetic elements can be used. Or, the magnetic elements can include different magnetic materials to vary the magnetic field strength at certain positions along a diameter of a substrate. At 808, the first array of magnetic elements is counterbalanced with a second array of magnetic elements. For example, a counterbalance magnetic field generator can be formed. At 810, the magnetic field strength of the counterbalance magnetic field generator can be modified or configured to form a certain shape of the profile for a portion of the magnetic field strength. A determination is made whether a minimum magnitude ought to be included in a magnetic profile at 812. If so, the second portion of the magnetic profile, which corresponds to the counterbalance magnetic field generator, is modified. The flow terminates at 816.

Figure 9:
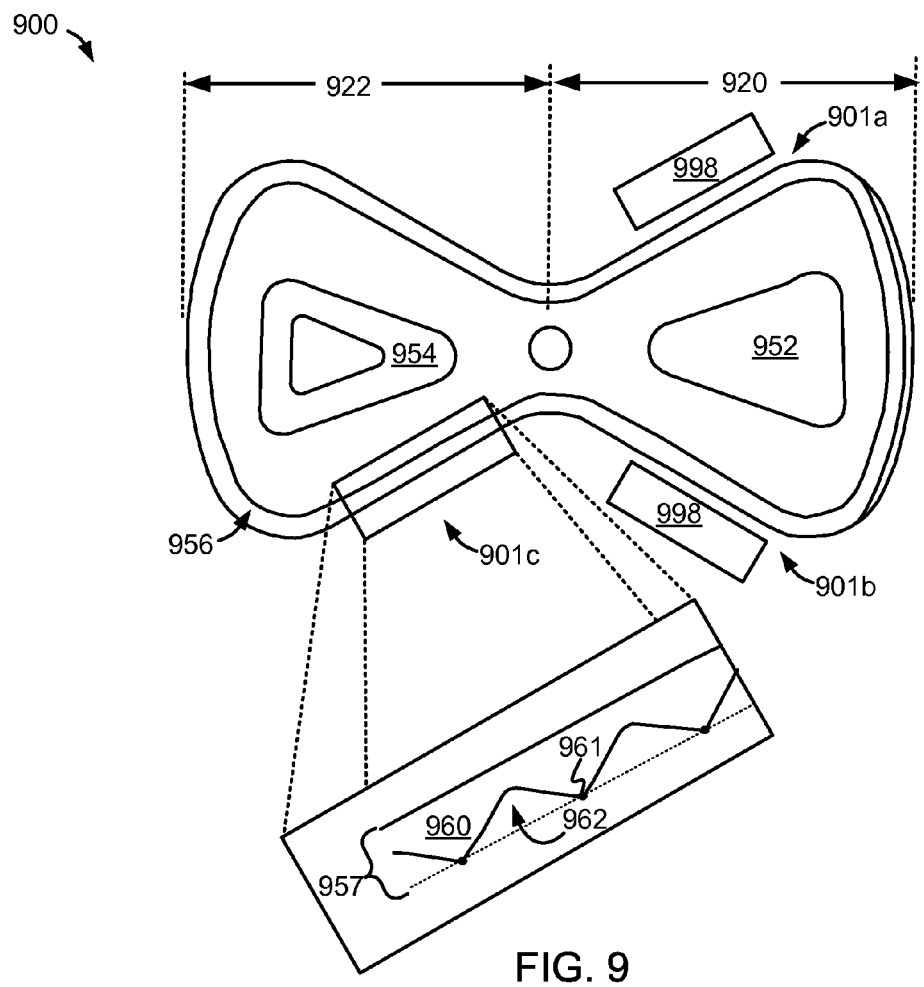
FIG. 9 depicts an example of a magnetic field generator apparatus implementing supplemental magnetic structures, according to some embodiments.

FIG. 9 depicts an example of a magnetic field generator apparatus implementing supplemental magnetic structures, according to some embodiments. Magnetic field generator apparatus 900 includes rotatable magnetic field generator 920 and counterbalance magnetic field generator 922, both including magnetic structures to generate magnetic fields, including, but not limited to, magnetic elements disposed in periphery 956 (or peripheral portions thereof) and within interior portions 952 and 954. Magnetic field generator apparatus 900 includes interior portions 952 and 954, which can be composed of magnetic elements. Further, magnetic field generator apparatus 900 includes one or more supplemental magnetic structures 998 disposed adjacent to (and can be coupled to) lateral portions 901*a* and/or 901*b*. Supplemental magnetic structures 998 can be configured to generate variable amounts of supplemental magnetic flux, and can include a variable number of magnetic elements (not shown). Supplemental magnetic structures 998 are configured to rotate in synchronicity with rotatable magnetic field generator 920.

Figure 10:
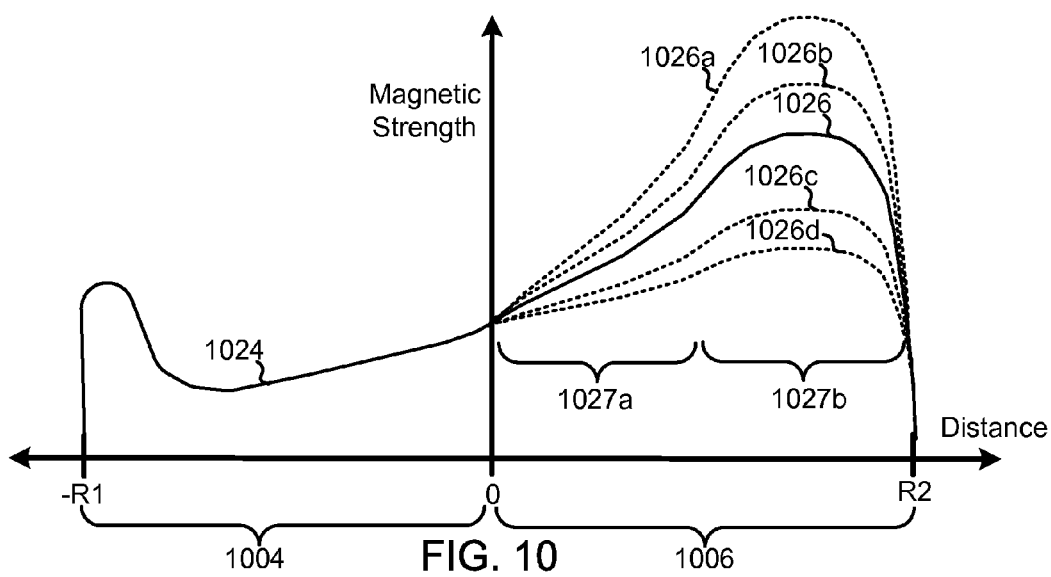
FIG. 10 depicts a magnetic profile having a configurable profile portion, according to some embodiments.

FIG. 10 depicts a magnetic profile having a configurable profile portion, according to some embodiments. In one implementation, a certain amount of magnetic elements and/or magnetic material can produce a profile portion 1026, in which a range of magnetic field strength including a peak magnitude is generated in region 1027*b* along a radial distance ("R2") 1006. The profile portion 1026 decreases in region 1027*a* from region 1027*b* to a reference point ("0"). Supplemental magnetic structures can include additional amounts of magnetic elements and/or magnetic material to form profile portions 1026*a* and 1026*b*, both of which have increased magnitudes. Or, supplemental magnetic structures can include fewer amounts of magnetic elements and/or magnetic material to form profile portions 1026*c* and 1026*d*, both of which have decreased magnitudes. Profile portion 1024 can be shaped and generated along radial distance ("R1") by a counterbalance magnetic field generator (not shown).

Referring back to FIG. 9, periphery 956 (or portions thereof) can be formed with zigzag-shaped lateral portions in which protruding edge surfaces are formed to facilitate ignition of plasma, among other things. For example, a portion 901*c* of periphery 956 is formed to include a zigzag portion 957 of metal (e.g., formed from a sheet of magnetically permeable metal) that includes protruding edge surfaces 961 between gaps 962. In some embodiments, protruding edge surfaces 961 are leading edges when rotating in a plane about an axis of rotation. In some cases, magnetic flux generated by underlying magnetic elements (not shown) can be concentrated or localized at or adjacent to protruding edge surfaces 961 or the surface 960 of zigzag portion 957. The surface area of surface 960 is less than if material resided at gaps 962, and, thus, facilities an increased amount of flux to pass through per unit area (e.g., facilitates increased magnetic flux).

Figure 11:
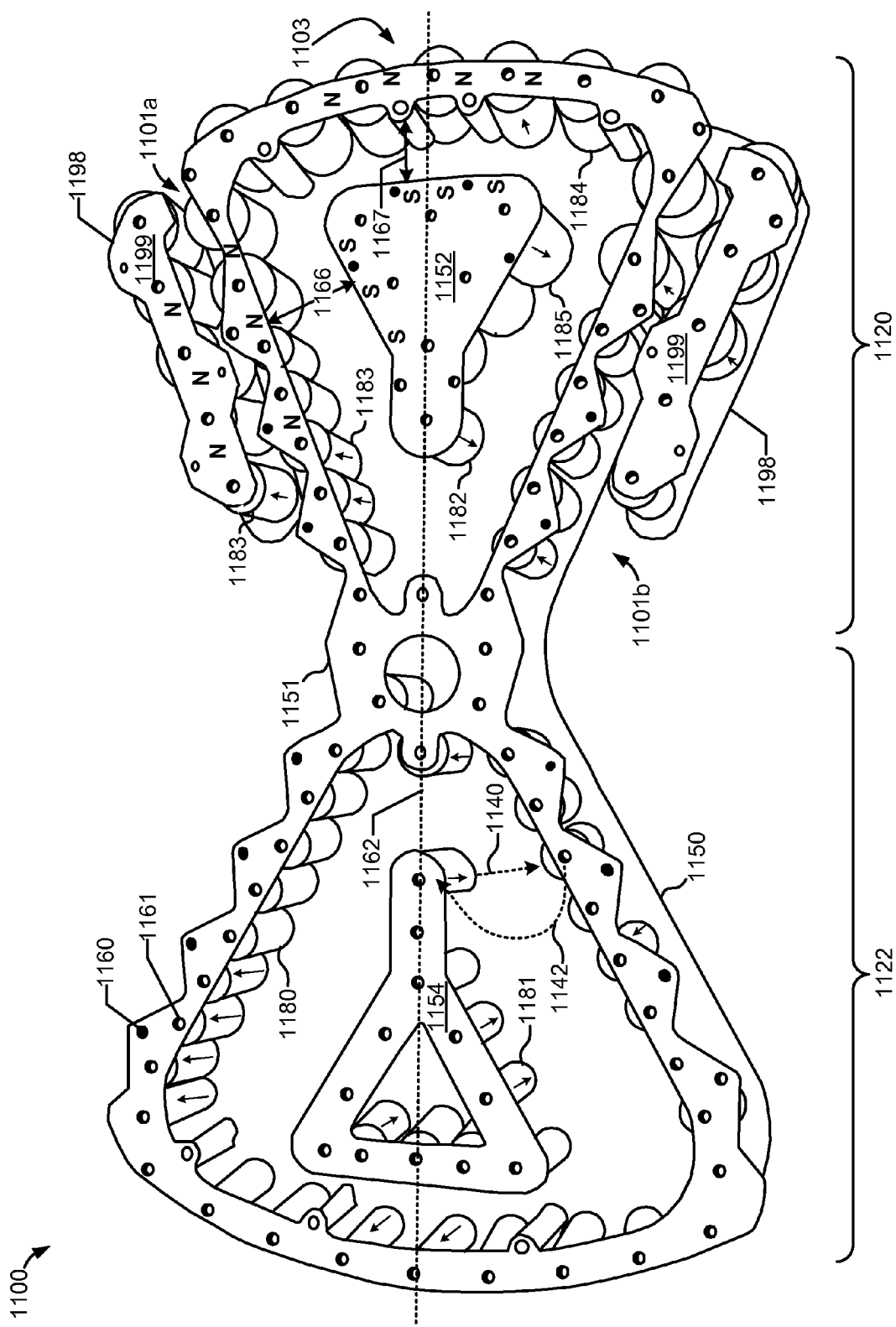
FIG. 11 depicts a specific example of one or more arrangements of magnetic elements used to form a magnetic field generator apparatus, according to some embodiments.

FIG. 11 depicts a specific example of one or more arrangements of magnetic elements used to form a magnetic field generator apparatus, according to some embodiments. Magnetic field generator apparatus 1100 includes a rotatable magnetic field generator 1120 and a counterbalance magnetic field generator 1122 formed on or integrated with a base 1150, which can be composed of magnetically permeable material, magnetic metals and the like. Base 1150 can be formed from a planar piece of magnetically permeable material. Rotatable magnetic field generator 1120 and counterbalance magnetic field generator 1122 are configured to generate a magnetic profile along medial line 1162 similar to magnetic profile 400 of FIG. 4. Optionally, rotatable magnetic field generator 1120 can include supplemental magnetic structures 1198 disposed adjacent to (and/or coupled to) lateral portions 1101*a* and 1101*b*. In some embodiments, magnetic field generator apparatus 1100 can be described as a bowtie-shaped magnetic generator.

In the examples shown, magnetic elements 1183, 1184, and 1180 are implemented as magnets having south poles disposed at base 1150 and north poles being adjacent zigzag-shaped surface 1151, which can be formed from a sheet of magnetically permeable material. The magnetic elements in supplemental magnetic structures 1198 are oriented similarly to form north poles at surfaces 1199, which can be formed from a sheet of magnetically permeable material. By contrast, magnetic elements 1181, 1182 and 1185 are implemented as magnets having north poles disposed at base 1150 and south poles being adjacent interior portions 1154 and 1152, either or both of which can be formed from a sheet of magnetically permeable material, Magnetic elements disposed between periphery surface 1151 and base 1150 at distal end 1103 are configured to generate flux in a direction that is radial (includes substantially radial) along radial segment 1167. Magnetic elements disposed between periphery surface 1151 and base 1150 at either lateral portion 1101*a* or 1101*b* are configured to generate flux in a direction that is tangential (includes substantially tangential) to radial lines or circumferential (includes substantially circumferential) about an axis of rotation. Flux generated tangentially and/or circumferentially can flow in a direction along flux path segment 1166. Further to the example shown in FIG. 11, the magnetic elements are arranged to generate, for example, a magnetic return flux path 1140 in or adjacent to the surface of base 1150, as well as another magnetic return flux path 1142 that passes through the environment, vacuum, or any other gaseous materials in a chamber to form a plasma. Filled hole 1161 represents an opportunity to remove a magnetic element to decrease the magnetic strength of a part of the magnetic profile, whereas an empty hole 1160 represents an opportunity to add a magnetic element to increase the magnetic strength.

Figure 12:
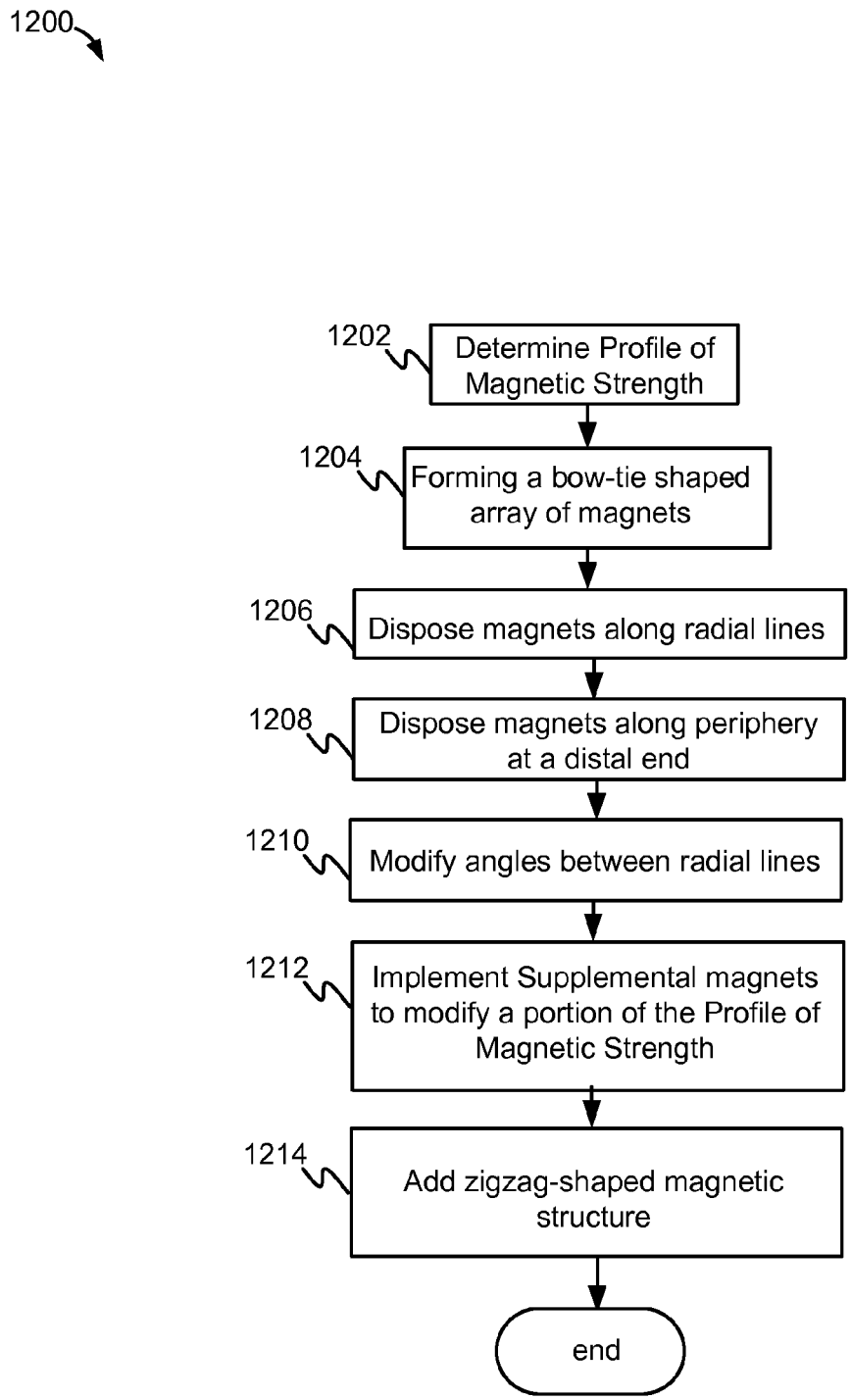
FIG. 12 is an example of a flow chart depicting a process by which to manufacture a bowtie-shaped magnetic field generator apparatus, according to an embodiment.

FIG. 12 is an example of a flow chart depicting a process by which to manufacture a bowtie-shaped magnetic field generator apparatus, according to an embodiment. In flow 1200, a profile of magnetic strength is determined at 1202. For example, a desired profile of magnetic strength can be based on the types of materials being deposited, the size of the substrate, the step and sidewall coverage, and/or other like factors. At 1204, a bowtie-shaped array of magnetic elements is formed. For example, magnetic elements can be disposed between a base, peripheral portions and interior portions for a rotatable magnetic field generator and a counterbalance magnetic field generator. At 1206, forming the bowtie-shaped array of magnetic elements includes disposing magnets along radial lines at 1206 of one or more lateral portions of either or both magnetic field generators. At 1208, forming the bowtie-shaped array of magnetic elements includes disposing magnets along the periphery at distal portions of either or both magnetic field generators. Angles between one or more sets of radial lines can be modified at 1210, according to various embodiments. Optionally, supplemental magnets can be implemented at 1212 to modify a portion of a magnetic strength profile. For example, more or fewer amounts of magnetic material can be implemented in, for example, supplemental magnetic structures 1198 of FIG. 11. Returning back to FIG. 12, an optional zigzag-shape can be implemented on the periphery of the magnetic field generator apparatus at 1214. The flow then terminates.

The magnetic field strength can be modified or configured to form a certain shape of a portion of the profile of magnetic field strength. For example, a supplemental array of magnetic elements can be used. Or, the magnetic elements can include different magnetic materials to vary the magnetic field strength at certain positions along a diameter of a substrate. At 1208, the first array of magnetic elements is counterbalanced with a second array of magnetic elements. For example, a counterbalance magnetic field generator can be formed. At 1210, the magnetic field strength of the counterbalance magnetic field generator can be modified or configured to form a certain shape of the profile for a portion of the magnetic field strength. A determination is made whether a minimum magnitude ought to be included in a magnetic profile at 1212. If so, the second portion of the magnetic profile, which corresponds to the counterbalance magnetic field generator, is modified. The flow terminates at 1216.

Figure 13:
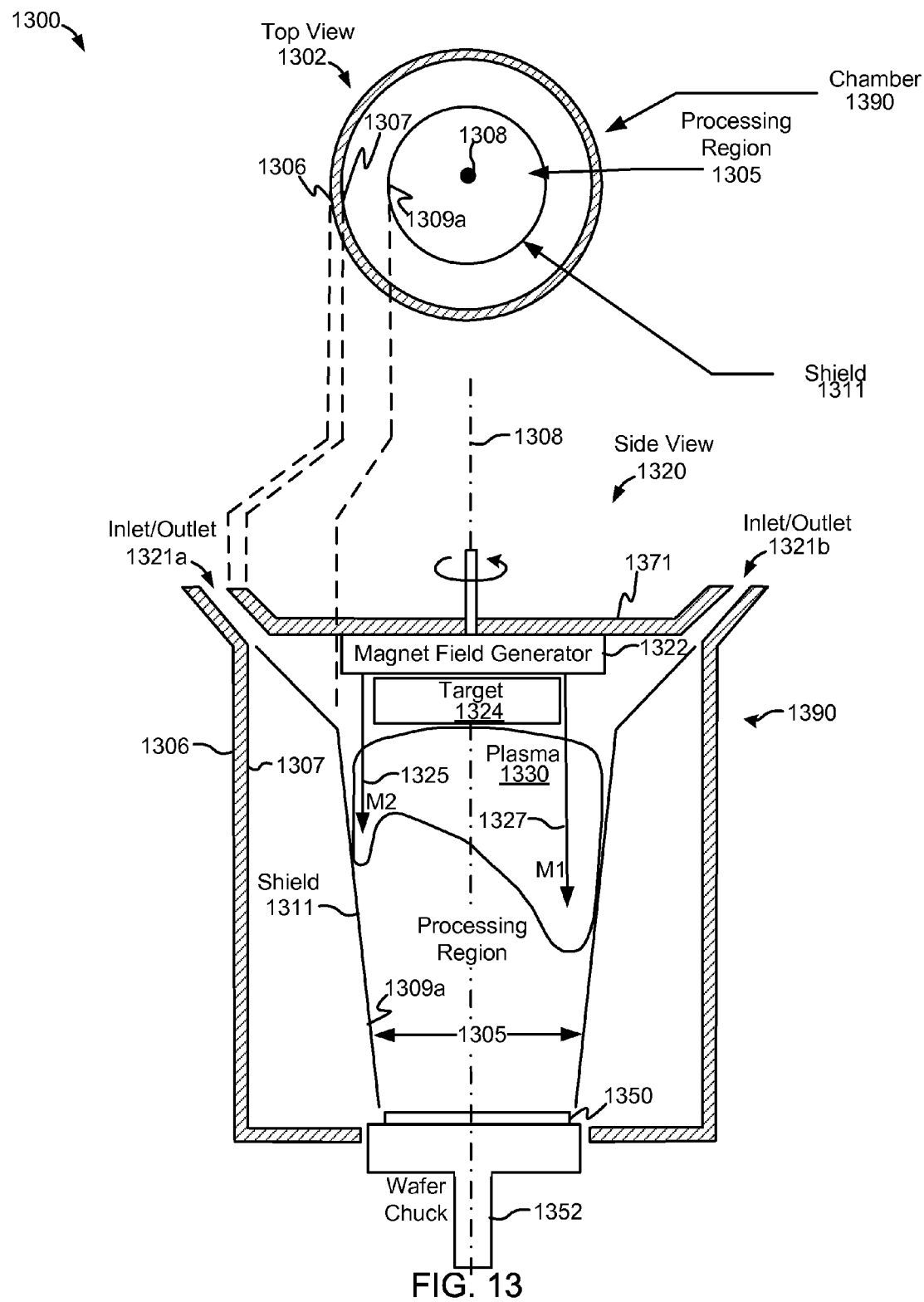
FIG. 13 depicts an example of a system for modifying a non-metal film on a semiconductor substrate in accordance with at least one embodiment.

FIG. 13 depicts an example of a system for modifying a non-metal film on a semiconductor substrate in accordance with at least one embodiment. Diagram 1300 depicts a top view 1302 and a side view 1320 of a plasma implementation system. In the example shown, chamber 1390 is configured to facilitate plasma processing in a plasma processing region 1305 to modify and/or form a semiconductor layer of a non-metal material (or other semiconductor materials) located, for example, on a substrate 1350. In some embodiments, the system shown in FIG. 13 is configured to perform physical vapor deposition ("PVD") to deposit a non-metal material, such as a chalcogenide material, onto a substrate to fabricate semiconductor device structures. As an example, the non-metal material that can be deposited on a substrate may form the memory material for a memory cell, such as a phase change memory cell. In some embodiments, the plasma implementation system can be configured to deposit a layer including germanium, antimony and tellurium ("GST"). In at least one embodiment, the GST can be deposited in the form: $Ge_2Sb_2Te_5$.

According to various embodiments, the plasma implementation system of FIG. 13 can include one or more magnetic field generators 1322 configured to rotate about centerline 1308 to generate magnetic fields and magnetic field profile portions for use in plasma processing in chamber 1390. Chamber 1390 includes an outer chamber wall 1306 and an inner chamber wall 1307, and can be configured to house a shield 1311. Shield 1311 includes an inner shield wall 1309*b* that is configured to enclose plasma processing region 1305. In some alternative embodiments, one or more magnetic field generators can be disposed within any regions between shield 1311 and inner chamber wall 1307, examples of which are disclosed in U.S. Pat. No. 8,956,516, which issued from U.S. application Ser. No. 12/551,356 and U.S. Pat. No. 8,936,703, which issued from U.S. application Ser. No. 12/551,379. Note that centerline 1308 need not be straight and can be curved or can include a turn. Note, too, that centerline 1308 can be oriented at 90 degrees (or any amount of degrees) from the position shown in FIG. 13.

To perform plasma processing within plasma processing region, chamber 1390 includes one or more ports. For example, inlet/outlet port 1321*a* can be configured as an inlet port to introduce a gas (e.g., an inert gas) into chamber 1390 for ionization purposes. An example of an inert gas is argon. Inlet/outlet port 1321*b* can be configured as an outlet port to evacuate gaseous byproducts. The plasma implementation system also includes a magnet field generator ("Magnetic Field Generator") 1322 positioned internal to chamber 1390, as shown, or external to chamber 1390 (e.g., above chamber top surface 1371) to confront a semiconductor layer on substrate 1350. Magnet field generator 1322 can include a rotatable magnetic field generator and a counterbalance magnetic field generator, as described herein. In accordance with the various embodiments, a rotatable magnetic field generator of magnet field generator 1322 can generate a portion of a magnetic field profile in plasma 1330 that includes a first magnitude ("MI") 1327. Further, a counterbalance magnetic field generator of magnet field generator 1322 can generate another portion of the magnetic field profile in plasma 1330 that includes a second magnitude ("M2") 1325. In some cases, a minimum magnitude of magnetic strength can be generated between magnitudes 1327 and 1325.

In some embodiments, magnet field generator 1322 can include a bowtie-shaped arrangement of magnetic elements positioned to implement a target material, the bowtie-shaped arrangement of magnetic elements being configured to rotate about centerline 1308. In some cases, the bowtie-shaped arrangement of magnetic elements includes a first magnetic field generator having a first triangular-shaped periphery (e.g., including sector shapes, diamond shapes, rectangular shapes, square shapes, or any other shape). The bowtie-shaped arrangement of magnetic elements also includes a second magnetic field generator having a second triangular-shaped periphery. At least one of the vertices of the second triangular-shaped periphery is coupled adjacent to centerline 1308 to one of the vertices of the first triangular-shaped periphery. The second magnetic field generator can have a mass equivalent to that of the first magnetic field generator to counteract a force generated by rotation about centerline 1308. The bowtie-shaped arrangement of magnetic elements can be configured to apply to plasma processing region 1305 magnetic flux having peak magnitudes of magnetic strength adjacent to the periphery of the semiconductor layer formed on substrate 1350 and a minimum magnitude of magnetic strength therebetween. Note that magnitudes 1327 and 1325, and the minimum magnitude of magnetic strength are disposed substantially along a diameter that rotates in synchronization with a medial line, such as medial line 1162 of FIG. 11, passing through the bowtie-shaped arrangement of magnetic elements.

The bowtie-shaped arrangement of magnetic elements can include a first group of magnets disposed along the periphery (e.g., magnetic elements disposed along peripheral structure or region 556 of FIG. 5) of the bowtie-shaped arrangement, and a second group of magnets disposed within the periphery of the bowtie-shaped arrangement (e.g., as interior portions within interior regions of either a rotatable magnetic field generator or a counterbalance magnetic field generator, or both). The first and the second groups of magnets are polarized so that magnet flux passes from the first group of magnets along the periphery to the second group of magnets within the interior. Note that the first and the second groups of magnets include subsets of magnets having different magnetic characteristics to generate different amounts of flux (e.g., magnets in each subset can generate a magnetic strength with different magnitudes, such as first magnitude, a second magnitude, a third magnitude, etc., as described FIG. 7). The first and the second groups of magnets respectively can constitute a first magnet pole and a second magnet pole. The first magnet pole can include a peripheral structure to establish the first magnetic pole, including a sawtooth-shaped edge in a plane of rotation.

The plasma implementation system can include an orifice configured to accept a wafer chuck 1352 that, among other things, supports substrate 1350 during plasma processing. Wafer chuck 1352 can be configured to receive a biasing signal, such as a radio-frequency ("RF") voltage signal, to facilitate generation of plasma in plasma processing region 1305 to perform RF sputtering deposition. In some implementations, wafer chuck 1352 can be described as an electrostatic chuck ("ESC") or "e-chuck."

A target 1324 can be disposed between magnetic field generator 1322 and substrate 1350. Or, target 1324 can be located at other regions within chamber 1390. Target 1324 can include one or more metal, metalloid, or non-metal elements. An example of a suitable non-metal as a constituent of target 1324 is Germanium ("Ge"), and examples of suitable metalloids include Antimony ("Sb") and Tellurium ("Te"). As used herein, the term "non-metal" can refer, at least in some embodiments, to both non-metals and metalloids. In some embodiments, target 1324 can include one or more chalcogenide elements. In one embodiment, target 1324 can include a material of germanium, antimony and tellurium ("GST") in the form of, for example, $Ge_2Sb_2Te_5$, or any variants thereof. This material can be used to form a layer of GST or other equivalent structures. Note that the plasma implementation system of FIG. 13 can be configured to perform other processing operations other than deposition, such as etching, according to some embodiments. In some embodiment, target 1324 can include metals, such as copper, aluminum, tin, and the like, as well as metal alloys and metal and non-metals.

Figure 14:
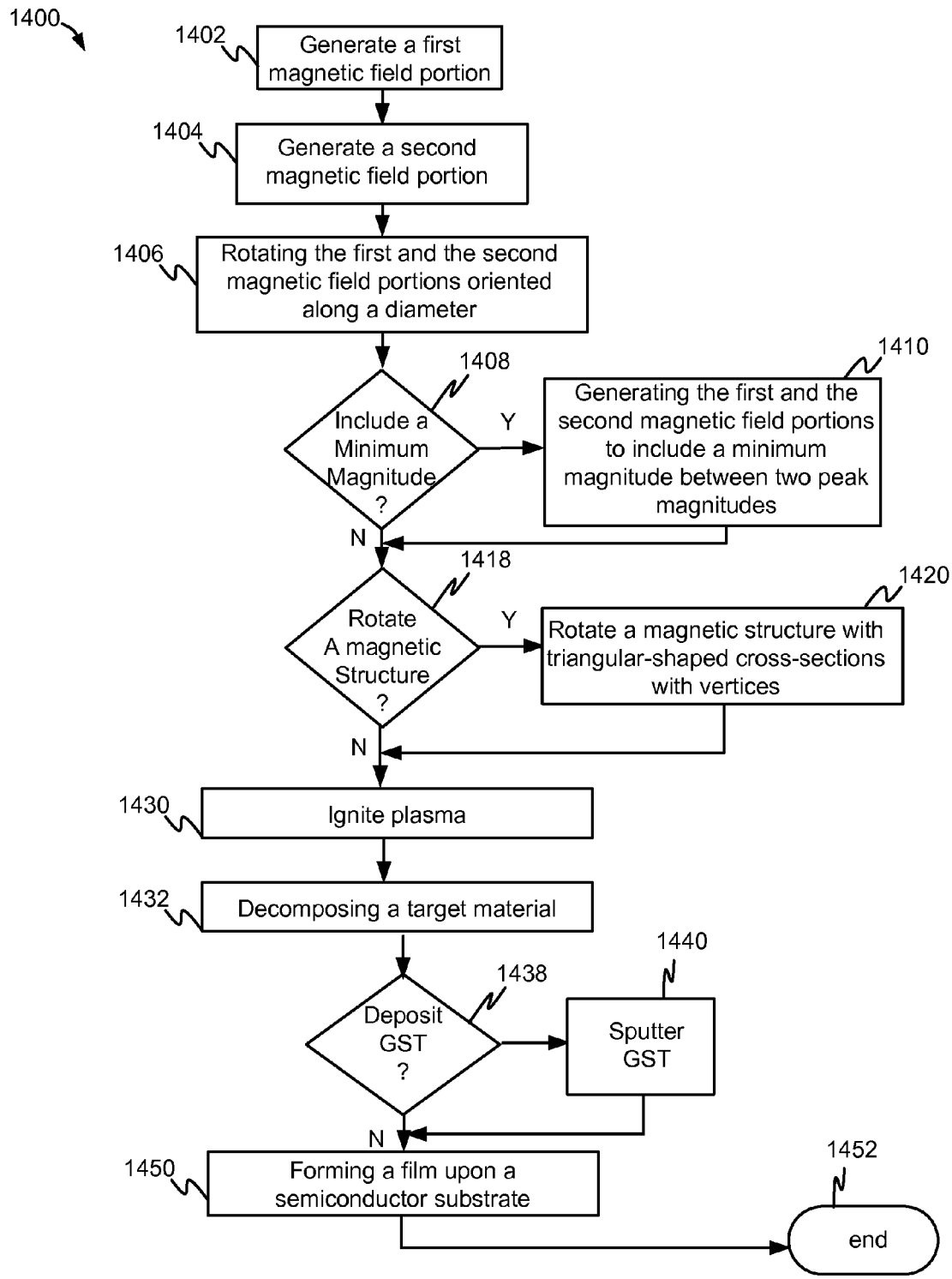
FIG. 14 is an example of a flow chart depicting a process by which to form semiconductor film using an example of a magnetic field generator, according to various embodiments.

FIG. 14 is an example of a flow chart depicting a process by which to form semiconductor film using an example of a magnetic field generator, according to various embodiments. In flow 1400, a first portion of a magnetic field is generated at 1402. For example, a desired profile of magnetic strength can be generated by a rotatable magnetic field generator, the profile having one or more ranges of magnitude of magnetic field strength adjacent a first circumferential portion of a semiconductor substrate. At 1404, a first portion of a magnetic field is generated at 1404. For example, another desired profile of magnetic strength can be generated by a counterbalance magnetic field generator, the profile having one or more ranges of peak magnitude of magnetic field strength adjacent to a second circumferential portion of the semiconductor substrate. The second circumferential portion can be at an endpoint of a diameter passing through an axis of rotation to another endpoint of the diameter at which the first circumferential portion resides. In some examples, the second peak magnitude is less than the first peak magnitude.

At 1406, first portion of the magnetic field and the second portion of the magnetic field are rotated about an axis of rotation. At 1408, a determination is made whether to generate a minimum magnitude. If not, flow 1400 moves to 1418. Otherwise, flow 1400 moves to 1410 at which a minimum magnitude of a magnetic field strength is disposed between a first and a second peak magnitude. At 1418, a determination is made whether to rotate a magnetic structure. If so, flow 1400 moves to 1420, at which a magnetic structure (e.g., one or more magnetic field generators) with triangular-shaped cross-sections is rotated in relation to a plasma processing region. At 1430, plasma is ignited. Optionally, plasma ignition is facilitated by rotating triangular-shaped cross-sections with zigzag peripheral portions in which edge protrusions are oriented in the direction of rotation. In some cases, the edge protrusions of zigzag edges facilitate localization of magnetic flux, which can facilitate ignition of the plasma. A target material is decomposed at 1432 to form a plasma at a plasma processing region adjacent the semiconductor substrate within a chamber. If GST or any chalcogenide material (or any other material) is included in the target material, it will be sputtered at 1440. GST can be deposited in the form of, for example, Ge2Sb2Te5, or any variants thereof. But if at 1438 GST is not included, than flow 1400 moves to 1450 at which a film is formed upon a semiconductor substrate. At 1450 (or at other portions of flow 1400), a wafer chuck configured to support the semiconductor substrate is biased, whereby a radio-frequency ("RF") voltage signal is used to supply RF power. The source generating the RF voltage has its impedance matched with the plasma including germanium, antimony and tellurium ("GST"). The generation of the RF voltage is then controlled to facilitate generation of the plasma to modify the non-metal film to deposit one or more layers of GST. The flow terminates at 1452.

Figure 15:
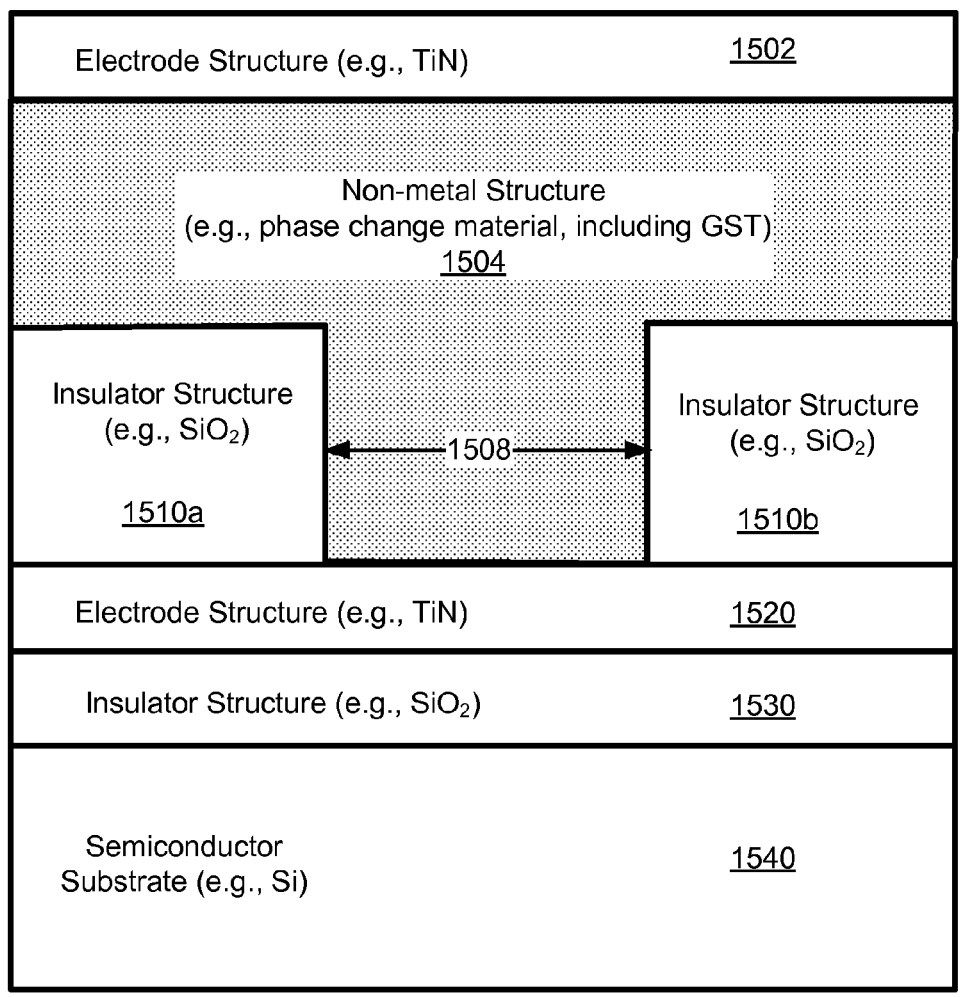
FIG. 15 depicts an example of a memory cell including a layer of chalcogenide-based material as formed by deposition processes and systems in accordance with at least one embodiment.

FIG. 15 depicts an example of a memory cell including a layer of chalcogenide-based material as formed by deposition processes and systems in accordance with at least one embodiment of the invention. Diagram 1500 includes a semiconductor substrate 1540, such as a silicon-based substrate, over which an insulator structure 1530 is formed. An example of such a structure is a SiO2 structure. On top of insulator structure 1530, a bottom electrode structure 1520 is formed as a titanium nitride ("TiN")-based or metal-based structure. Upon the bottom electrode structure 1520, insulator structures 1510a and 1510b are formed as, for example, SiO2 structures. A non-metal layer 1504, such as a chalcogenide layer, is formed over insulator structures 1510a and 1510b. In some instances, arrangements of magnetic field generators can reduce or eliminate, for example, voids in area 1508, and/or form crystal structure having relatively fewer defects than otherwise might be the case. In some embodiments, non-metal layer 1504 includes a material of germanium, antimony and tellurium ("GST") in the form of, for example, $Ge_2Sb_2Te_5$. A top electrode structure 1502 can be formed upon non-metal layer 1504. In various other embodiments, the systems, apparatuses, and methods can be used to perform deposition of metals, including copper ("Cu") and any other metal or metal-based material, as well as any non-metal or non-metal based material.

In at least some of the embodiments of the invention, one or more of the structures and/or functions of any of the above-described features can be implemented in software, hardware, firmware, circuitry, or a combination thereof. Note that the structures and constituent elements above, as well as their functionality, can be aggregated with one or more other structures or elements. Alternatively, the elements and their functionality can be subdivided into constituent sub-elements, if any.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

The invention claimed is:

1. A plasma implementation system comprising:
   a chamber configured to facilitate plasma processing;
   a wafer chuck positioned to support a semiconductor substrate in the chamber; and
   a bowtie-shaped arrangement of magnet elements positioned in the chamber and configured to yield a field that induces ionization of a target material positioned between the magnet elements and the wafer chuck to enable a target material to be deposited on a semiconductor substrate,
   wherein the magnet elements are configured to rotate about an axis of rotation,
   wherein the bowtie-shaped arrangement of magnet elements comprises
      a first magnetic field generator having a first triangular-shaped periphery in a plane that is perpendicular to the axis of rotation, and
      a second magnetic field generator having a second triangular-shaped periphery in a plane that is perpendicular to the axis of rotation, and
         wherein each triangular-shaped periphery of each magnetic field generator comprises a distal portion between a pair of lateral portions that are angled toward each other in a direction away from the distal portion.

2. The plasma implementation system of claim 1 wherein each pair of lateral portions defines an angle with a vertex that is defined at a reference point, which is located either coincident with the axis of rotation or adjacent to the axis of rotation.

3. The plasma implementation system of claim 1 further comprising a shield within the chamber that defines a plasma processing region;
   wherein the magnet elements apply magnetic flux to the plasma processing region such that the magnet flux has peak magnitudes of magnetic strength at its perimeter, which is adjacent to a periphery of a semiconductor substrate, and a minimum magnitude of magnetic strength between the peak magnitudes.

4. The plasma implementation system of claim 3 wherein the peak magnitudes and the minimum magnitude of magnetic strength are disposed substantially along a diameter that rotates in synchronization with a medial line passing through the bowtie-shaped arrangement of magnet elements.

5. The plasma implementation system of claim 1 wherein the bowtie-shaped arrangement of magnet elements comprises:
   a first group of magnets disposed along the triangular-shaped periphery of the first magnetic field generator; and
   a second group of magnets disposed along the triangular-shaped periphery of the second magnetic field generator,
   wherein the first and the second groups of magnets are polarized so that magnet flux passes from the first group of magnets to the second group of magnets.

6. The plasma implementation system of claim 5 wherein the first and the second groups of magnets comprise:
   subsets of magnets having different magnetic characteristics to generate different amounts of flux.

7. The plasma implementation system of claim 5 wherein the first and the second groups of magnets respectively comprise:
   a first magnet pole and a second magnet pole.

8. The plasma implementation system of claim 7 wherein the first magnet pole comprises:
   a peripheral structure to establish the first magnetic pole, wherein the peripheral structure includes a sawtooth-shaped edge in a plane of rotation.

9. The plasma implementation system of claim 1 further comprising:
   a supplemental magnetic element disposed adjacent to an external side of the lateral portion of the triangular-shaped periphery of one of the magnetic field generators.

10. The plasma implementation system of claim 1 further comprises:
    a radio-frequency ("RF") power generator configured to apply an RF voltage to the wafer chuck.

11. The plasma implementation system of claim 1 wherein each distal portion has an arc-shaped periphery.

12. A plasma implementation system comprising:
    a chamber configured to facilitate plasma processing;
    a wafer chuck positioned to support a semiconductor substrate in the chamber; and
    a bowtie-shaped arrangement of magnet elements positioned in the chamber and configured to yield a field that induces ionization of a target material positioned between the magnet elements and the wafer chuck to enable a target material to be deposited on a semiconductor substrate,
    wherein the magnet elements are configured to rotate about an axis of rotation,
    wherein the bowtie-shaped arrangement of magnet elements comprises
    a first magnetic field generator having a first triangular-shaped periphery in a plane that is perpendicular to the axis of rotation, and a second magnetic field generator having a second triangular-shaped periphery in a plane that is perpendicular to the axis of rotation,
wherein each triangular-shaped periphery of each magnetic field generator comprises a distal portion between a pair of lateral portions that are angled toward each other in a direction away from the distal portion; and
wherein the second magnetic field generator comprises a mass approximately equivalent to that of the first magnetic field generator to counteract a force generated by rotation about the axis of rotation.

13. The plasma implementation system of claim 12 wherein each pair of lateral portions defines an angle with a vertex that is defined at a reference point, which is located either coincident with the axis of rotation or adjacent to the axis of rotation.

14. The plasma implementation system of claim 12 wherein the bowtie-shaped arrangement of magnet elements comprises:
a first group of magnets disposed along the triangular-shaped periphery of the first magnetic field generator; and
a second group of magnets disposed along the triangular-shaped periphery of the second magnetic field generator,
wherein the first and the second groups of magnets are polarized so that magnet flux passes from the first group of magnets to the second group of magnets.

15. The plasma implementation system of claim 14 wherein the first and the second groups of magnets comprise:
subsets of magnets having different magnetic characteristics to generate different amounts of flux.

16. The plasma implementation system of claim 14 wherein each of the first and the second groups of magnets comprises:
a first magnet pole and a second magnet pole.

17. The plasma implementation system of claim 16 wherein the first magnet pole comprises:
a peripheral structure to establish the first magnetic pole, wherein the peripheral structure includes a sawtooth-shaped edge in a plane of rotation.

18. The plasma implementation system of claim 12 further comprising:
a supplemental magnetic element disposed adjacent to an external side of the lateral portion of the triangular-shaped periphery of one of the magnetic field generators.

19. The plasma implementation system of claim 12 wherein each distal portion has an arc-shaped periphery.

20. A plasma implementation system comprising:
a chamber configured to facilitate plasma processing;
a shield within the chamber that defines a plasma processing region;
a wafer chuck positioned to support a semiconductor substrate in the chamber;
a bowtie-shaped arrangement of magnet elements positioned in the chamber and configured to yield a field that induces ionization of a target material positioned between the magnet elements and the wafer chuck to enable a target material to be deposited on a semiconductor substrate,
wherein the magnet elements are configured to rotate about an axis of rotation,
wherein the bowtie-shaped arrangement of magnet elements comprises
a first magnetic field generator having a first triangular-shaped periphery in a plane that is perpendicular to the axis of rotation, and
a second magnetic field generator having a second triangular-shaped periphery in a plane that is perpendicular to the axis of rotation,
wherein each triangular-shaped periphery of each magnetic field generator comprises a distal portion between a pair of lateral portions that are angled toward each other in a direction away from the distal portion; and
a supplemental magnetic element disposed adjacent to an external side of the lateral portion of the triangular-shaped periphery of the first magnetic field generator to influence a first peak magnitude of magnetic strength of the field yielded by the magnetic elements.

21. The plasma implementation system of claim 20 wherein the magnet elements apply magnetic flux to the plasma processing region such that the magnet flux has peak magnitudes of magnetic strength at its perimeter, which is adjacent to a periphery of a semiconductor substrate, and a minimum magnitude of magnetic strength between the peak magnitudes; and
wherein the peak magnitudes and the minimum magnitude of magnetic strength are disposed substantially along a diameter that rotates in synchronization with a medial line passing through the bowtie-shaped arrangement of magnet elements.

22. The plasma implementation system of claim 20 wherein each pair of lateral portions defines an angle with a vertex that is defined at a reference point, which is located either coincident with the axis of rotation or adjacent to the axis of rotation.

23. The plasma implementation system of claim 20 wherein the bowtie-shaped arrangement of magnet elements comprises:
a first group of magnets disposed along the triangular-shaped periphery of the first magnetic field generator; and
a second group of magnets disposed along the triangular-shaped periphery of the second magnetic field generator,
wherein the first and the second groups of magnets are polarized so that magnet flux passes from the first group of magnets to the second group of magnets.

24. The plasma implementation system of claim 23 wherein the first and the second groups of magnets comprise:
subsets of magnets having different magnetic characteristics to generate different amounts of flux.

25. The plasma implementation system of claim 23 wherein each of the first and the second groups of magnets comprises:
a first magnet pole and a second magnet pole.

26. The plasma implementation system of claim 25 wherein the first magnet pole comprises:
a peripheral structure to establish the first magnetic pole, wherein the peripheral structure includes a sawtooth-shaped edge in a plane of rotation.

27. The plasma implementation system of claim 20 wherein the second magnetic field generator comprises a mass approximately equivalent to that of the first magnetic field generator to counteract a force generated by rotation about the axis of rotation.

28. The plasma implementation system of claim 20 wherein each distal portion has an arc-shaped periphery.

\* \* \* \* \*